United States Patent
Umemoto et al.

(10) Patent No.: US 6,747,895 B2
(45) Date of Patent: Jun. 8, 2004

(54) NONVOLATILE SEMICONDUCTOR MEMORY, DATA DELETION METHOD OF NONVOLATILE SEMICONDUCTOR MEMORY, INFORMATION PROCESSING APPARATUS AND NONVOLATILE SEMICONDUCTOR MEMORY SYSTEM

(75) Inventors: Yukiko Umemoto, Kodaira (JP); Toshihiro Tanaka, Akiruno (JP); Hiroyuki Tanikawa, Kodaira (JP); Yutaka Shinagawa, Iruma (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/083,602

(22) Filed: Feb. 27, 2002

(65) Prior Publication Data

US 2002/0159291 A1 Oct. 31, 2002

(30) Foreign Application Priority Data

Apr. 25, 2001 (JP) .......................................... 2001-127205

(51) Int. Cl.$^7$ ................................................. G11C 16/04
(52) U.S. Cl. ............................. 365/185.18; 365/185.24; 365/185.26
(58) Field of Search ........................ 365/185.18, 185.23, 365/185.24, 185.25, 185.26, 185.27, 185.29, 185.33, 185.11, 189.09, 218

(56) References Cited

U.S. PATENT DOCUMENTS

| | | | | |
|---|---|---|---|---|
| 5,642,072 A | * | 6/1997 | Miyamoto et al. | 327/535 |
| 5,644,534 A | * | 7/1997 | Soejima | 365/185.23 |
| 5,761,127 A | * | 6/1998 | Akaogi et al. | 365/185.27 |
| 5,898,335 A | * | 4/1999 | Miyamoto et al. | 327/535 |
| 5,898,616 A | * | 4/1999 | Ono | 365/185.17 |
| 6,014,329 A | * | 1/2000 | Akaogi et al. | 365/185.09 |

* cited by examiner

*Primary Examiner*—Gene Auduong
(74) *Attorney, Agent, or Firm*—Miles & Stockbridge P.C.

(57) ABSTRACT

This inventing is intended to shorten data deletion time of a nonvolatile semiconductor memory such as a flash memory (EEPROM). When deleting data written to a memory cell MC0 among flash memory cells MC0 to MC2 formed on a semiconductor substrate PSUB through a separation region NiSO, a voltage of p type well PWL0 in which the memory cell MC0 is formed is raised to 10V and a voltage of the separation region NiSO is raised to 12V by using a voltage application unit different from a voltage application unit applying a voltage to the p type well PWL0. As a result, parasitic capacitances $Ca_1$ and $Ca_2$ generated between p type wells PWL1 and PWL2 in which the unselected memory cells MC1 and MC2 are formed and the separation region NiSO, respectively, and a parasitic capacitance Cb generated between the separation region NiSO and the semiconductor substrate PSUB are charged by the voltage application units. It is, therefore, possible to shorten time required to charge the parasitic capacitances and to shorten the deletion time.

23 Claims, 34 Drawing Sheets

*FIG.26A*        *FIG.26B*
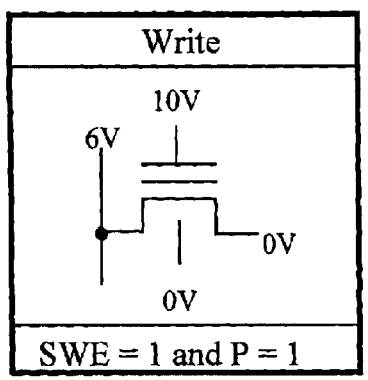 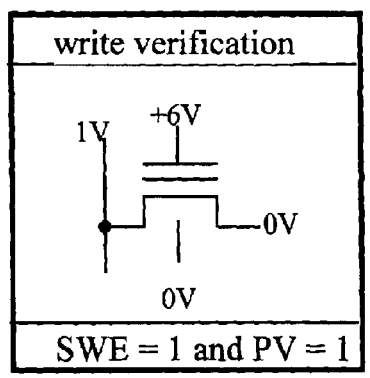
*FIG.26C*
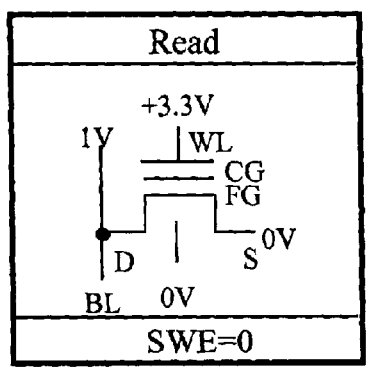
*FIG.26D*        *FIG.26E*
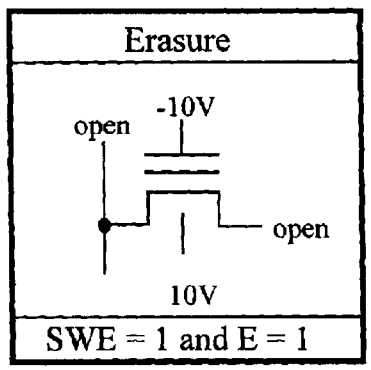 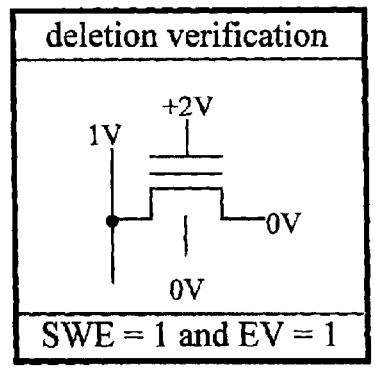

write flow deletion flow detection circuit

NONVOLATILE SEMICONDUCTOR MEMORY, DATA DELETION METHOD OF NONVOLATILE SEMICONDUCTOR MEMORY, INFORMATION PROCESSING APPARATUS AND NONVOLATILE SEMICONDUCTOR MEMORY SYSTEM

TECHNICAL FIELD OF THE INVENTION

The present invention relates to a nonvolatile semiconductor memory, a data deletion method of the nonvolatile semiconductor memory, an information processing apparatus and a nonvolatile semiconductor memory system. More particularly, the present invention relates to a technique effective to be applied to a nonvolatile semiconductor memory (EEPROM: Electric Erasable Programmable Read Only Memory) capable of electrically writing and deleting data.

BACKGROUND OF THE INVENTION

An EEPROM represented by, for example, a flash memory includes a source and a drain which are formed on the surface of a well in a semiconductor substrate, a charge accumulation layer (or floating electrode) which is formed on the source and the drain through a gate insulating film, and a control electrode which is provided on the charge accumulation layer (or floating electrode) through an insulating film. The EEPROM determines data ("1" or "0") which is held therein depending on whether or not electrons are injected into the charge accumulation layer (or floating electrode) (depending on the magnitude of the threshold value of each memory cell).

To write or delete data to and from this EEPROM, hot electrons which are generated by the potential difference between the control electrode of a selected memory cell and the semiconductor substrate (well, source or drain) or electrons which are emitted by a tunnel phenomenon are injected or pulled out into and from the charge accumulation layer (or floating electrode).

SUMMARY OF THE INVENTION

In the case where an operation for pulling out electrons from the charge accumulation layer (or floating electrode) of the EEPROM (flash memory) is defined as deletion, it is necessary to apply a high negative voltage (negative voltage having the high absolute value of the voltage) to the control electrode of a memory cell selected to secure the above-stated potential difference during this deletion.

However, if a high negative voltage (negative voltage having the high absolute value of the voltage) is applied to the control electrode, it is also required to increase the withstand voltage of an MISFET (Metal Insulator Semiconductor Field Effect Transistor) which constitutes peripheral circuits driving the control electrode. To increase the withstand voltage of the MISFET, it is necessary to make the gate insulating film thicker. If the gate insulating film becomes thicker, the driving capability of the MISFET is deteriorated and a read rate is eventually sacrificed.

To prevent this disadvantage, a technique for obtaining a desired potential difference while lowering a negative voltage applied to the control electrode (lowering the absolute value of the voltage) by applying a positive voltage to the well in the semiconductor substrate, is considered.

The inventors of the present invention have been dedicated to study and development related to nonvolatile semiconductor memories. After considering the above-stated technique, the inventors were faced with a problem regarding time required to reach a deletion potential (time required to pull out a desired quantity of electrons).

The inventors applied themselves closely to the cause of this problem. As a result, the inventors reached the conclusion that the problem is caused by the fact that the well is electrically separated from the semiconductor substrate and a parasitic capacitance is thereby generated in a separation region.

In other words, if a positive voltage is applied to the well in the semiconductor substrate, the well is electrically separated from the semiconductor substrate and a separation region opposite in conductive type to the well is thereby formed between the well and the semiconductor substrate. If data is deleted from the EEPROM (flash memory), it is required to charge a parasitic capacitance generated between the well and the separation region, the separation region and the semiconductor substrate, making deletion time (including time required until the voltage becomes a desired value) longer.

Furthermore, during data deletion, if it is determined whether or not the threshold voltage of a memory cell is a predetermined threshold voltage and it is found that the threshold voltage of the memory cell is higher than the desired threshold voltage, then the data is re-deleted so as not to apply an excessive stress (a series of these operations will be referred to as "a deletion verification operation" hereinafter).

While the threshold voltage of the memory cell is determined, the charged parasitic capacitance stated above should be discharged. In addition, if the data is re-deleted from the memory cell, the parasitic capacitance thus discharged should be charged again.

As can be seen, during the deletion verification discharged, with the result that the problem of the increase of deletion time becomes more serious.

It is an object of the present invention to provide a technique capable of shortening time required to delete data from a nonvolatile semiconductor memory such as an EEPROM (flash memory).

The above and other objects and the novel features of the present invention will be readily apparent from the description of the specification of the present application and accompanying drawings.

Among the inventions disclosed in the present application, typical inventions will be briefly outlined as follows.

(1) A nonvolatile semiconductor memory according to the present invention includes: a semiconductor substrate; a first semiconductor region; a second semiconductor region formed on the first semiconductor region; a memory cell section formed on the second semiconductor region; and a control section which outputs a control signal instructing a voltage generation section to generate a voltage applied to the second semiconductor region when or before receiving an access instruction from an outside indicating that it is necessary to charge the second semiconductor region, and which indicating a control signal for discharging the second semiconductor region when indicated from the outside to discharge the second semiconductor region, to the voltage generation section.

(2) A nonvolatile semiconductor memory according to the present invention includes voltage application means for applying a voltage to a second semiconductor region (NiSO) formed between a semiconductor substrate and a first semiconductor region in which a nonvolatile memory cell is formed, the means different from means for applying a voltage to the first semiconductor region.

(3) A nonvolatile semiconductor memory according to the present invention includes means for prohibiting a voltage from being applied to a second semiconductor region formed between a semiconductor substrate and a first semiconductor region in which a nonvolatile memory cell is formed.

BRIEF DESCRIPTION OF THE DRAWINGS

FIG. 26A shows the write operation of the flash memory (EEPROM) in an embodiment according to the present invention, FIG. 26B shows the write verification operation of the flash memory (EEPROM) in an embodiment according to the present invention, FIG. 26C shows the read operation of the flash memory (EEPROM) in an embodiment according to the present invention, FIG. 26D shows the erasure operation of the flash memory (EEPROM) in an embodiment according to the present invention, and FIG. 26E shows the deletion verification operation of the flash memory (EEPROM) in an embodiment according to the present invention;

DESCRIPTION OF THE PREFERRED EMBODIMENTS

The present invention will be described hereinafter while dividing the invention to a plurality of sections or a plurality of embodiments if it is necessary to do so for the sake of convenience. Unless specified otherwise, these divided sections or embodiments are of relevance to one another and one is the modification, detail, addition of the others.

Furthermore, in the following embodiments, if the number of elements and the like (including the number, numerical values, quantities, ranges thereof) are mentioned, the elements are not limited thereto but the numbers and the like thereof may be equal to or greater than specific ones except that the number is clearly specified and the number should be limited to a specific number in view of the principle.

Needless to say, constituent elements (including steps and the like) of the embodiments are not always essential unless specified otherwise or unless they are obviously essential based on the principle of the invention.

Likewise, in the following embodiments, if the shapes, positional relationships and the like of the constituent elements and the like are mentioned, they include those substantially approximate or similar thereto unless otherwise specified or unless the approximate or similar shapes and the like are obviously not included therein. The same thing is true for the numerical values and the ranges of the constituent elements stated above.

Furthermore, the constituent elements having the same functions are denoted by the same reference symbols throughout the drawings which are referred to while explaining the embodiments and they will not be repeatedly described.

In addition, in the embodiments, some drawings are shown hatched to help understand the drawings even if they are not cross-sectional views.

The embodiments of the present invention will be described hereinafter in detail with reference to the drawings.

First Embodiment

First, the configuration of a flash memory which the inventors of the present invention studied to attain the present invention, as well as the data write and deletion operations and the objects of the flash memory will be described.

Figure 24:
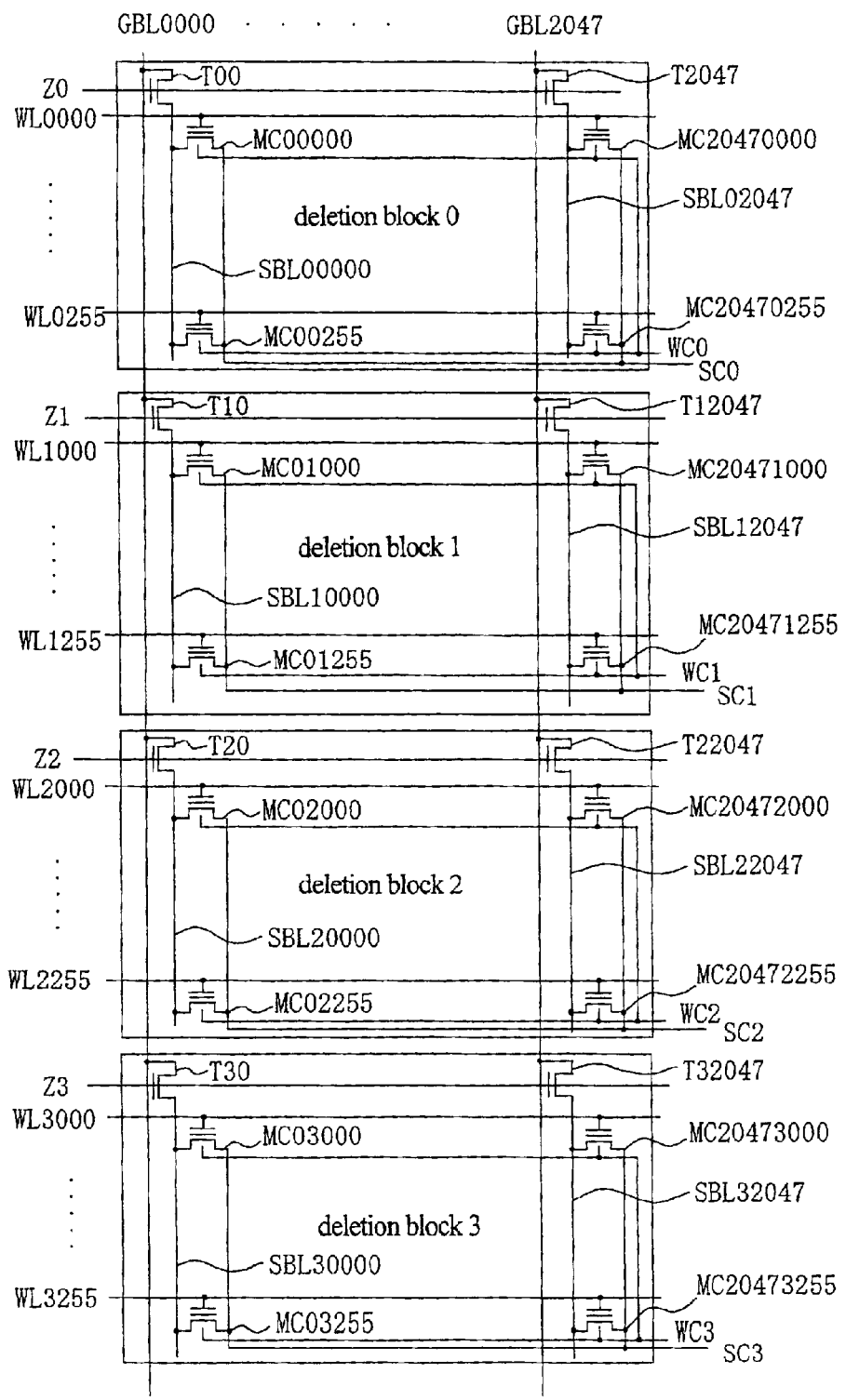
FIG. 24 is a circuit diagram of the important parts of a memory array showing one example of the memory array in a flash memory (EEPROM) in an embodiment according to the present invention.

The flash memory which the inventors of the present invention studied is, for example, a DiNOR type flash memory wherein data lines are hierarchically formed. FIG. 24 is a circuit diagram showing the important parts of the DiNOR type flash memory.

As shown in FIG. 24, data lines are hierarchically formed into main data (bit) lines GBL0000 to GBL2047 and sub-data (sub-bit) lines SBL00000 to SBL32047. Namely, a main data (bit) line (e.g., GBL0000) is connected to the sub-data (sub-bit) lines (e.g., SBL00000 to SBL30000) through hierarchical transistors (e.g., T00 to T30).

The gate electrodes of the hierarchical transistors connected to the main data line are electrically connected to signal wirings (gate lines) Z0 to Z3, respectively. In addition, the sources of memories in respective blocks are connected to common source lines SC0 to SC3 every blocks.

For example, a plurality of memory cells MC00000 to MC00255 are connected in parallel between the sub-data line, e.g., SBL00000 and the common source line SC0.

It is assumed herein that a plurality of memory cells MC00000 to MC20470255 connected to the main data lines GBL0000 to GBL2047 through the hierarchical transistors T00 to T02047 which are connected to the signal wiring (gate line) Z0 in common are "deletion block 0". Likewise, it is assumed that a plurality of memory cells MC01000 to MC20471255 connected to the main data lines GBL0000 to GBL12047 through the hierarchical transistors T10 to T12047 which are connected to the signal wiring (gate line) Z1 in common are "deletion block 1". It is assumed that a plurality of memory cells MC02000 to MC20472255 connected to the main data lines GBL0000 to GBL2047 through the hierarchical transistors T20 to T22047 which are connected to the signal wiring (gate line) Z2 in common are "deletion block 2". It is assumed that a plurality of memory cells MC03000 to MC20473255 connected to the main data lines GBL0000 to GBL2047 through the hierarchical transistors T30 to T32047 which are connected to the signal wiring (gate line) Z3 in common are "deletion block 3".

The control electrodes of the adjacent memory cells in the same row, e.g., MC00000 to MC20470000 are electrically connected to the same word line, e.g., WL0000.

While memory connection is DiNOR type connection for hierarchically forming data lines in FIG. 24, it is also possible to adopt AND type connection for hierarchically forming source lines in addition to the DiNOR type connection. In this case as in the case of the above, a positive voltage is applied to a well in which the memory cells are formed during data deletion. Due to this, it is necessary to hierarchically form the data lines at least in units of deletion blocks. In addition, each of the deletion block units can be hierarchically formed into a plurality of sub-units. If the positive voltage is applied to the well in which the memory cells are formed, the voltages of all the sub-data lines in the deletion block to which the positive voltage is applied become the positive voltage. Therefore, to maintain the positive voltage according to each deletion block (to apply the positive voltage to the memories which are not to be deleted if the positive voltage is applied to the main data line), it is necessary to hierarchically form the data lines at least in units of deletion blocks.

Figure 25:
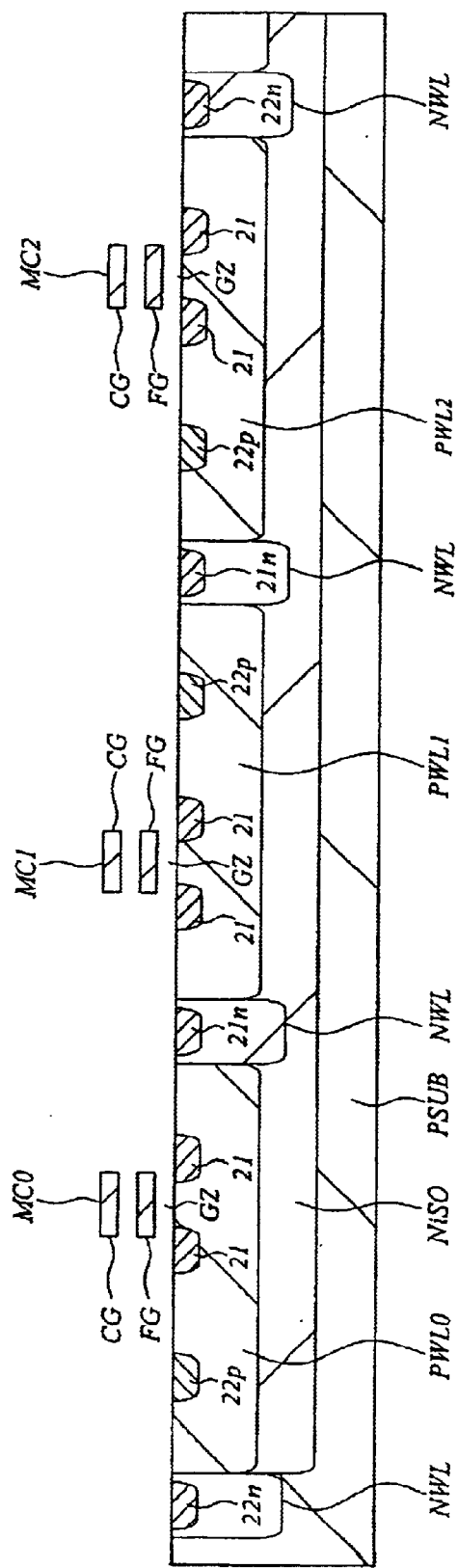
FIG. 25 is a cross-sectional view of the important parts of the flash memory (EEPROM) in an embodiment according to the present invention.

The respective memory cells (MC00000 to MC20473255) are formed on the main surfaces of p type wells PWL0 to PWL2 formed in a semiconductor substrate PSUB as shown in FIG. 25. In each of these p type wells PWL0 to PWL2, the source and drain regions 21 of each memory cell are formed. A floating gate electrode FG is formed above the region between the source and the drain through a gate insulating film GZ. A control electrode CG is formed above the floating gate electrode (charge accumulation layer) FG through an insulating film. As can be seen, each memory cell has a two-gate-electrode-layer structure to enable data to be written to the memory cell by, for example, injecting electrons (hot electrons) into the floating gate FG and enable data to be deleted by pulling out electrons injected into the floating gate electron FG from the floating gate electrode FG using an FN (Fowler-Nordheim) tunnel phenomenon.

As shown in FIG. 25, a separation region NiSO which is formed of an n type semiconductor region is formed between the p type wells PWL0 to PWL2 and the semiconductor substrate PSUB. In addition, the memory cell MC0 is a memory cell in the deletion block 0 stated above and formed above the p type well PWL0. Likewise, the memory cells (e.g., MC1) in the deletion block 1 are formed above the p type well PWL1, and the memory cells (e.g., MC2) in the deletion block 2 are formed above the p type well PWL2. The p type wells PWL0 to PWL2 are electrically separated from one another by n type wells NWL's. Further, semiconductor regions 22n (n type) ad 22p (p type) which become voltage applied regions, exist in each of the p type wells PWL0 to 2 and each n type well NWL, respectively.

The write, read and deletion operations of the above-stated flash memory will be described with reference to FIGS. 26A to 26E.

The write operation of the flash memory will first be described. As shown in FIG. 26A, to write data to a memory cell, a voltage of 10V is applied to the control electrode CG (word line) of the memory cell, a voltage of 6V is applied to the drain region (main data line) of the memory cell, and the voltages of the p type well and the source region of the memory cell are maintained to be 0V (a ground potential). As a result, a current is carried to the channel region (which is the region between the source and the drain) of the memory cell and hot electrons are thereby generated. The hot electrons thus generated are injected into the floating electrode FG ("write operation").

At this moment, it is determined whether or not the threshold voltage (the quantity of electrons injected into the floating gate FG) of the memory cell has become a desired value. If it is determined that the threshold voltage of the memory cell does not become the desired value, data is rewritten ("write verification operation").

If it is determined whether or not the threshold voltage of the memory cell has become a desired value in a series of these operations, a voltage of 6V is applied to the control electrode CG (word line) of the memory cell, a voltage of 1V is applied to the drain region (main data line) of the memory cell and the voltages of the p type well and the source region of the memory cell are maintained to be 0V as shown in FIG. 26B. At this moment, the above-stated determination is performed by determining whether or not a current is carried between the source and the drain of the memory cell. If the current is carried therebetween, it is determined that the threshold voltage of the memory cell does not become the desired value ("NG").

Figure 27A:
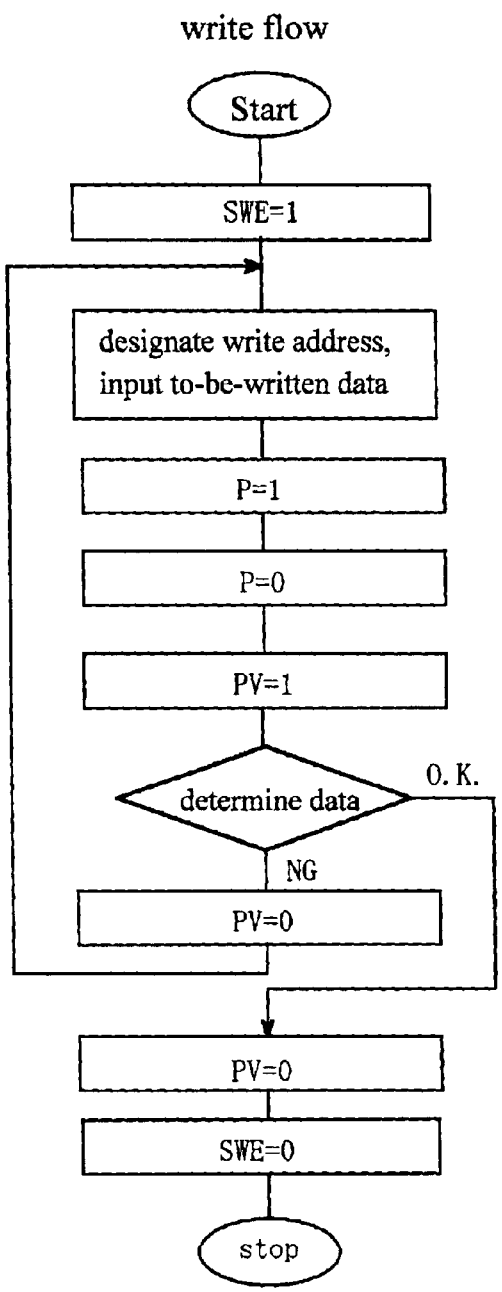
FIG. 27A shows the write operation flow of the flash memory (EEPROM) in an embodiment according to the present invention.

FIG. 27A is a flow chart of the write operation of the flash memory up to the stop of data write. As shown in FIG. 27A, when an operation signal SWE becomes "1", a write address is designated and to-be-written data is inputted. Next, a write signal P becomes "1" and the write operation stated above is carried out. Further, the write signal P becomes "0", a write verification signal PV becomes "1" and data (threshold voltage) determination is carried out. In this way, the data determination and the data rewrite are repeatedly carried out until the threshold voltage of the memory cell becomes the desired value (until the data determination result becomes "OK").

After the data determination result becomes "OK", the write verification signal PV becomes "0", the operation signal SWE becomes "0" and the write operation is stopped.

The read operation of the flash memory will next be described. As shown in FIG. 26C, to read data from the memory cell, a voltage of 3.3V is applied to the control electrode CG (word line) of the memory cell, a voltage of 1V is applied to the drain region (main data line) of the memory cell and the voltages of the p type well and the source region of the memory cell are maintained to be 0V. At this moment, the data ("1" or "0") is read from the memory cell depending on whether or not a current is carried between the source and the drain of the memory cell. If the current is carried therebetween, it means that no electrons are injected into the floating electrode FG of the memory cell (the threshold voltage of the memory cell is not higher than 3.3V) and that data of, for example, 1 has been stored in the memory cell. If no current is carried between the source and the drain, it means that electrons are injected into the floating electrode FG of the memory cell (threshold voltage of the memory cell is not lower than 3.3V) and that data of, for example, "0" has been stored in the memory cell.

The deletion operation of the flash memory will next be described. As shown in FIG. 26D, to delete data written from the memory cell, a voltage of −10V is applied to the control electrode CG (word line) of the memory cell, a voltage of 10V is applied to the p type well, and the drain region (main data line) of the memory cell and the source region thereof are maintained to be open (in a floating state). Thereafter, electrons are discharged from the floating gate FG to the channel region (between the source and the drain) of the memory cell by an FN tunnel phenomenon ("deletion operation").

Even in this deletion operation, it is determined whether or not the threshold voltage (the quantity of electrons injected into the floating gate FG) of the memory cell is lowered to a desired value ("deletion verification operation"). If the threshold voltage of the memory cell is not lowered to the desired threshold voltage, data deletion is carried out again.

When it is to be determined whether or not the threshold voltage of the memory cell becomes the desired value, a voltage of 2V is applied to the control electrode CG (word line) of the memory cell, a voltage of 1V is applied to the drain region (main data line) of the memory cell and the voltages of the p type well and the source region of the memory cell are maintained to be 0V as shown in FIG. 26E. At this moment, the above-stated determination is carried out based on whether or not a current is carried between the source and the drain of the memory cell. If no current is carried therebetween, it is determined that the threshold voltage of the memory cell is not lowered to the desired value (determination result is "NG").

Figure 27B:
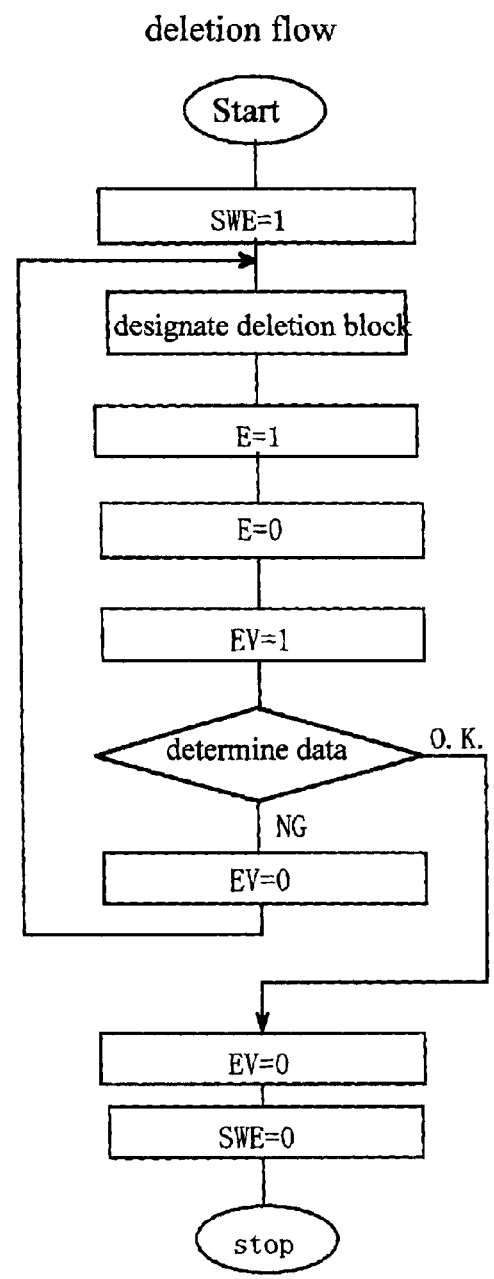
FIG. 27B shows the deletion operation flow of the flash memory (EEPROM) in an embodiment according to the present invention.

FIG. 27B is a flow chart of the deletion operation of the flash memory up to the stop of data deletion. As shown in FIG. 27B, when the operation signal SWE becomes "1", a deletion block is designated. Next, a deletion signal E becomes "1" and the above-stated deletion operation is carried out. Further, the deletion signal E becomes "0", a deletion verification signal EV becomes "1" and data (threshold voltage) determination is thereby carried out. In this way, the data determination and the data re-deletion are repeatedly carried out until the threshold voltage of the memory cell is lowered to the desired value (until the determination result becomes "OK").

After the data determination result becomes "OK", the deletion verification signal EV becomes "0" and the operation signal SWE becomes "0", thereby stopping the deletion operation.

This deletion operation will be described in more detail.

As already described above, when the data written to the memory cell is deleted, a positive voltage of 10V is applied to the p type well. This is intended to prevent the negative voltage (the absolute value of the negative voltage) applied to the control electrode from becoming high. That is, by applying a positive voltage of 10V to the p type well, the negative voltage (the absolute value of the negative voltage) applied to the control electrode is lowered to thereby secure a voltage difference which causes a tunnel phenomenon.

Further, as described above with reference to FIG. 25, the separation region NiSO is formed to electrically separate the p type wells PWL0 to PWL2 from the semiconductor substrate PSUB. If the data written to the memory cell is deleted, a voltage of, for example, 10V is applied to this separation region NiSO, thereby preventing a current from flowing into the p type wells PWL0 to PWL2 and the semiconductor substrate PSUB.

Figure 28:
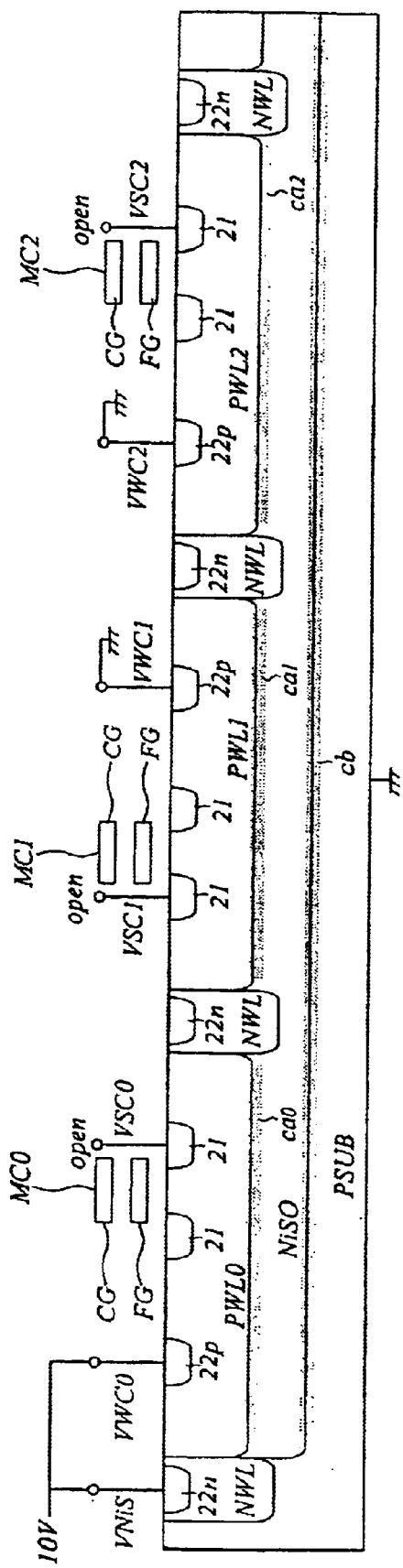
FIG. 28 shows the configuration of the flash memory and voltages applied to the p type wells and the separation region during the written data deletion to explain the object of the present invention.

FIG. 28 shows voltages applied to the p type wells PWL0 to PWL2 and the separation region NiSO when the data written to the memory cell is deleted. In FIG. 28, the MC0 is a memory cell in the deletion block 0 shown in FIG. 24, the MC1 is a memory cell in the deletion block 1 shown in FIG. 24, and that the MC2 is a memory cell in the deletion block 2 shown in FIG. 24. A voltage application state in a case where the data written to the memory cell (e.g., MC0) in the deletion block 0 is deleted is shown in FIG. 28.

As shown in FIG. 28, a voltage of 10V is applied to the separation region NiSO through the n type well NWL. In addition, a voltage of 10V is applied to the p type well PWL0 in which the selected memory cell MC0 is formed, and the voltages of the p type wells PWL1 and PWL2 in which the unselected memory cells MC1 and MC2 are formed, respectively, are maintained to be 0V. On the other hand, the voltage of the semiconductor substrate PSUB is maintained to be 0V. The source and drain regions 21 of the respective memory cells are in open states (floating states, OPEN).

At this moment, a voltage (vccm, 10V) is supplied to the separation region NiSO and the p type well PWL0 in which the selected memory cell MC0 is formed from the same voltage generation circuit.

Figure 30:
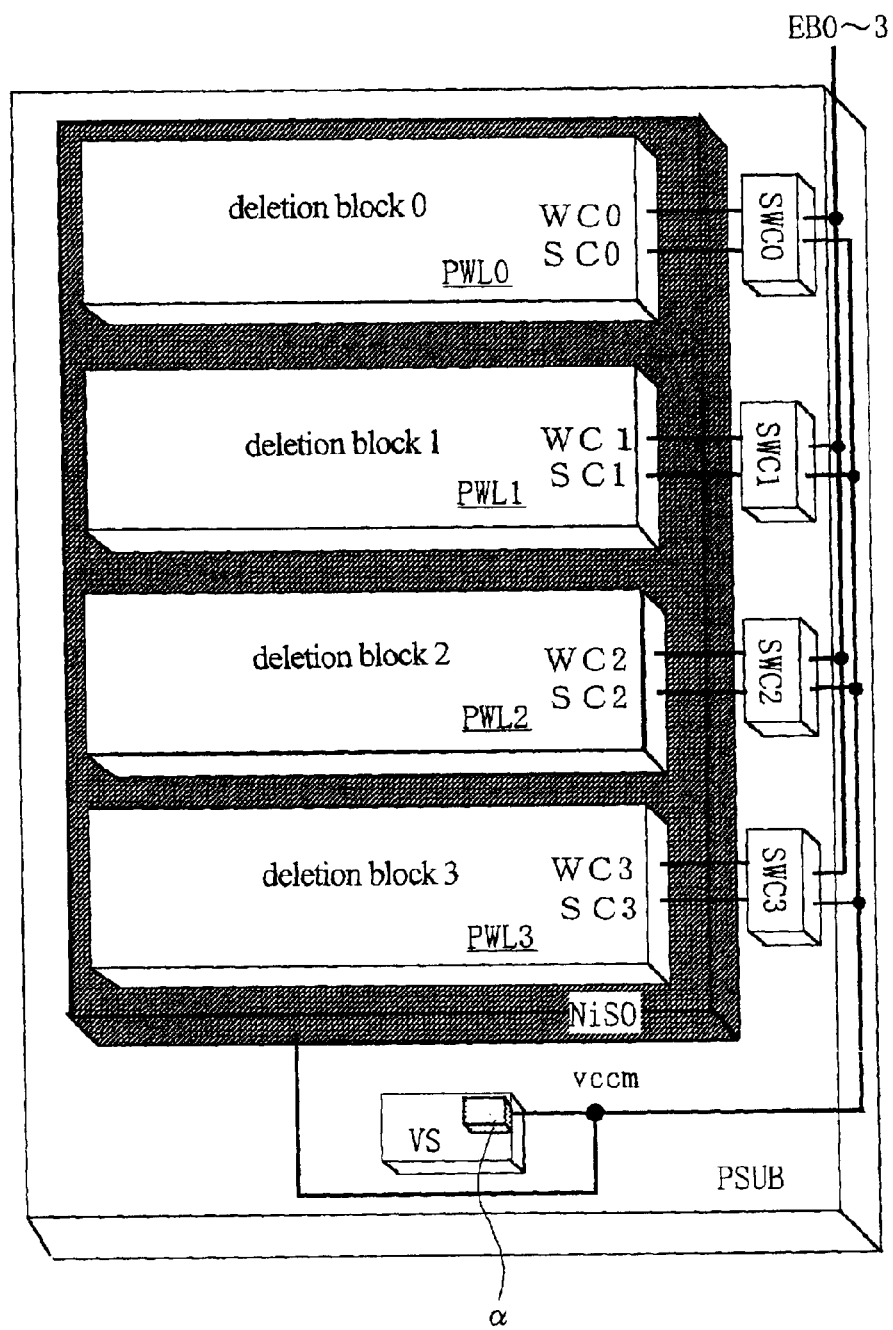
FIG. 30 shows the connection among the separation region, the p type wells and the voltage generation circuit of the flash memory shown in FIG. 28.

FIG. 30 shows the connection among the separation region NiSO, the P type wells PWL0 to PWL3 and a voltage generation circuit α. As shown in FIG. 30, the predetermined voltage (Vccm, 10V) is supplied from the voltage generation circuit α in a power supply circuit VS to the separation region NiSO. In addition, the predetermined voltage (Vccm, 10V) is supplied to the p type wells PWL0 to PWL3 through control circuits SWC0 to SWC3, respectively. Erasure block signals EB0 to EB3 are inputted into the control circuits SWC0 to SWC3 and one of the deletion blocks 0 to 3 (p type wells PWL0 to PWL3) is selected in accordance with the deletion signals and the voltage stated above is supplied to the selected deletion block. Further, the deletion signal E is inputted into the voltage generation circuit α and the above-stated voltage is supplied to the separation region NiSO in accordance with this deletion signal.

Furthermore, as shown in FIG. 28, parasitic capacitances $Ca_1$ and $Ca_2$ are generated between the p type wells PWL1 and 2 in which the unselected memory cells MC1 and MC2 are formed, respectively and the separation region NiSO, respectively. A parasitic capacitance Cb is generated between the separation region NiSO and the semiconductor substrate PSUB.

Figure 31:
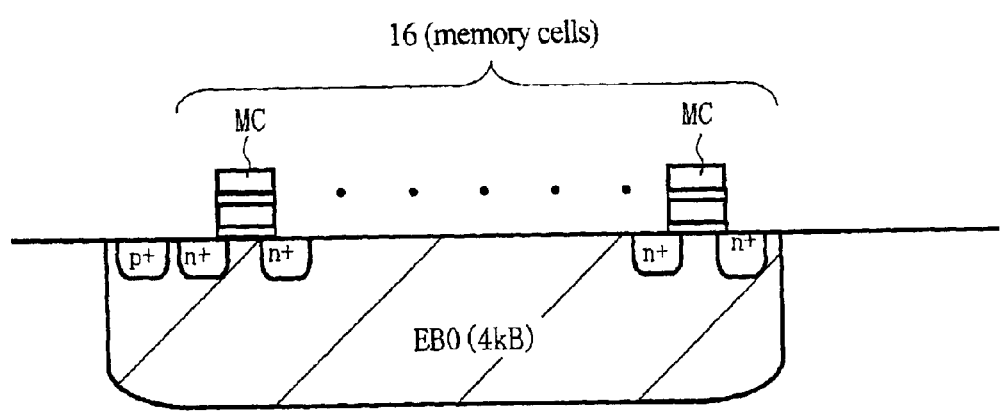
FIG. 31 is an explanatory view for memory cells in the deletion block of the flash memory.
Figure 32A:
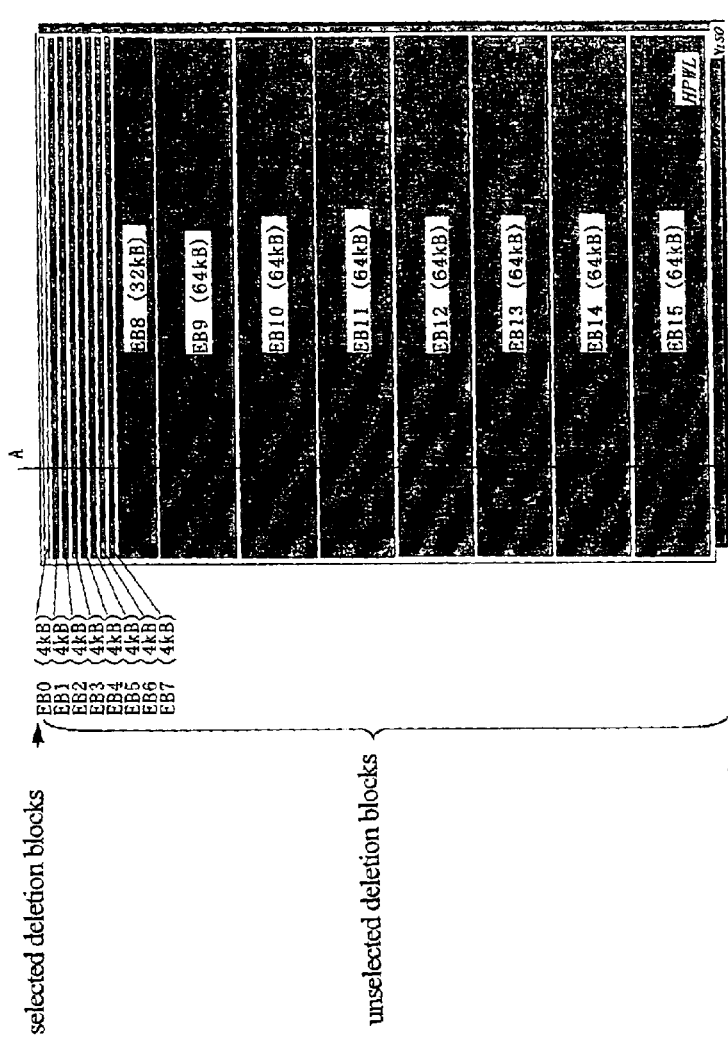
FIGS. 32A and 32B are explanatory views for the deletion blocks of the flash memory.
Figure 32B:
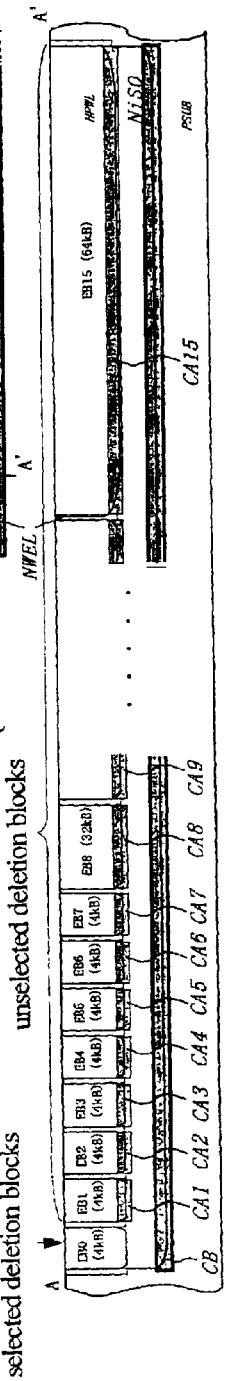

In data deletion, therefore, it is necessary to charge these parasitic capacitances $Ca_1$, $Ca_2$ and Cb. It takes some time until the voltages of the p type well PWL0 in which the selected memory cell MC0 is formed and the separation region NiSO become 10V. FIG. 28 only shows the two memory cells MC1 and MC2 as the memory cells in the unselected deletion blocks 1 and 2, respectively. However, if the memory capacity of each deletion block is 4 kB, 16 memory cells are arranged in the lateral direction of the drawing sheet as shown in FIG. 31 and 2048 memory cells are arranged in the depth direction of the drawing sheet. Further, as shown in FIG. 32A, if the entire capacity of the semiconductor memory is 512 kB (4 kB×8 blocks, 32 kB×1 block and 64 kB×7 blocks), for example, parasitic capacitances (CA1 to CA15 and CB) corresponding to the capacity of 508 kB (4161536 memory cells) of unselected deletion blocks (4 kB×7 blocks, 32 kB×1 block and 64 kB×7 blocks) are generated with respect to the selected deletion block (EB0) having a capacity of 4 kB.

Figure 29:
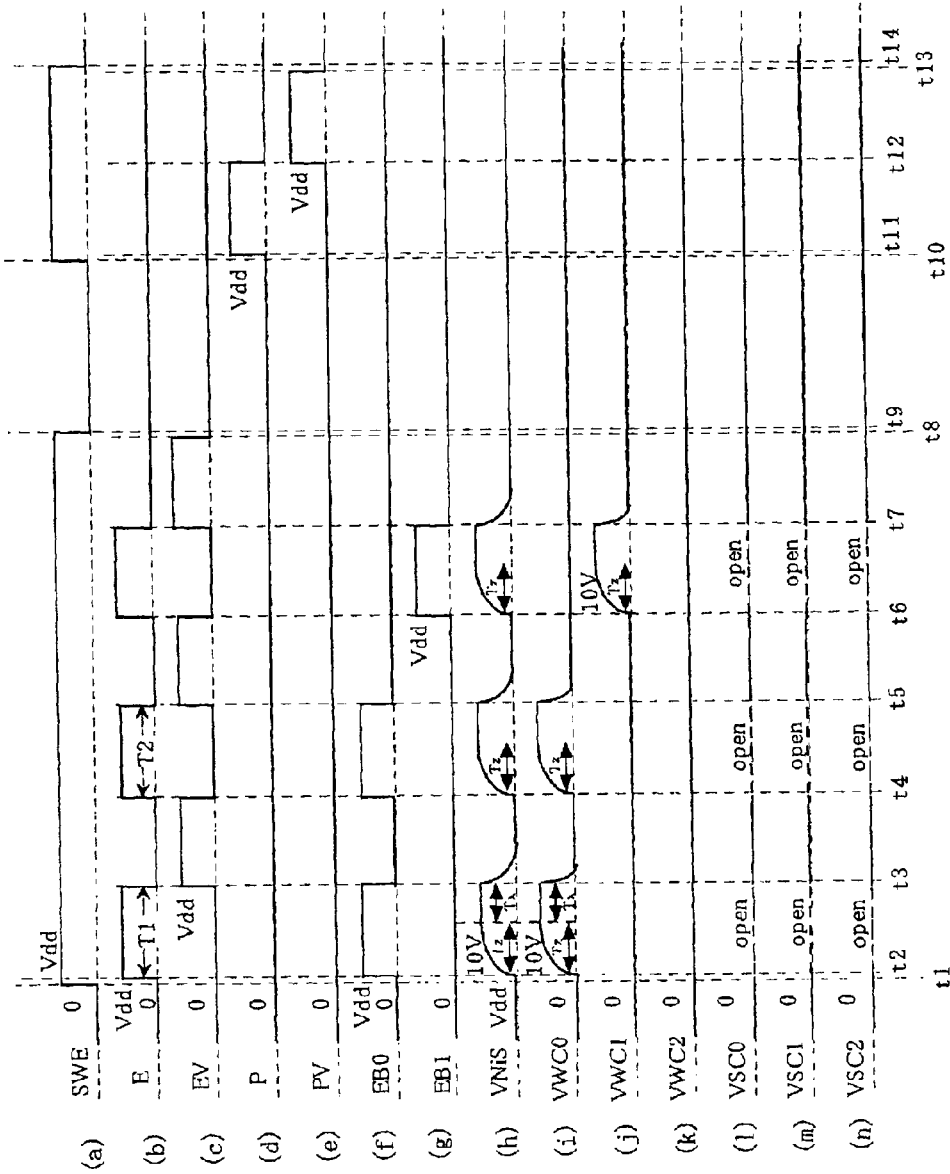
FIG. 29 is a timing chart showing the voltage changes of respective signals and sections of the flash memory shown in FIG. 28 during data deletion.

FIG. 29 is a timing chart showing the voltage changes of respective signals and sections during data deletion.

At time t1, the operation signal SWE becomes "1". At time t2, the deletion signal E becomes "1" and the deletion block signal EB0 becomes "1", whereby the deletion block 0 is designated and data deletion starts. At this time, a voltage of 10V is applied to the separation region NiSO and the p type well PWL0 in which the selected memory cell MC0 is formed, respectively. As indicated by (h) and (i) of FIG. 29, it takes time Tz until the voltage (VNiS) of the separation region NiSO and the voltage (VWC0) of the p type well PWL0 become 10V, respectively.

After a deletion operation is then carried out for a predetermined period Tx (Tx=T1−Tz), the deletion signal E becomes "0" and the deletion verification signal EV becomes "1" at time t3, whereby a verification operation starts. While this deletion verification signal EV is "1" (at t3 to t4), data (threshold voltage) determination is carried out. At this moment, the voltages of the separation region NiSO and the p type well PWL0 in which the selected memory cell MC0 is formed are maintained to be Vdd (driving voltage) and 0V, respectively.

If this data (threshold voltage) determination result shows that there is a memory cell which is not deleted at the first deletion (at time T1), the deletion signal E becomes "1", the deletion verification signal EV becomes "0" and the deletion block signal EB0 becomes "1" at time t4, whereby the re-deletion of the deletion block EB0 starts. At this moment, too, a voltage of 10V is applied to the separation region NiSO and the p type well PWL0 in which the selected memory cell MC0 is formed, respectively. As indicated by (h) and (i) of FIG. 29, it takes time Tz until the voltage (VNiS) of the separation region NiSO and the voltage (VWC0) of the p type well PWL0 become 10V, respectively.

After a deletion operation is then carried out for a predetermined time Tx (Tx=T1−Tz), the deletion signal E becomes "0" and the deletion verification signal EV becomes "1" at time t5, whereby a verification operation starts. While this deletion verification signal is "1" (at t5 to t6), data (threshold voltage) determination is carried out. At this moment, the voltages of the separation region NiSO and the p type well PWL0 in which the selected memory cell MC0 is formed are maintained to be Vdd and 0V, respectively.

Next, if the data (threshold voltage) determination result is "OK", the deletion signal E becomes "1" and the deletion block signal EB1 becomes "1" at time t6, whereby the deletion block 1 is designated and data deletion starts. At this moment, a voltage of 10V is applied to the separation region NiSO and the p type well PWL1 in which the selected memory cell MC1 is formed, respectively. As indicated by (h) and (i) of FIG. 29, it takes time Tz until the voltage (VNiS) of the separation region NiSO and the voltage (VWC1) of the p type well PWL1 become 10V, respectively.

After a deletion operation is then carried out for a predetermined period of time Tx (Tx=T1−Tz), a verification operation starts (at t7 to t8) as in the case of the deletion block signal EB0.

During the above-stated periods (t1 to t8), in the periods (t2 to t3, t4 to t5 and t6 to t7) in which deletion and re-deletion are carried out, the source and drain regions 21 of each memory cell are maintained to be open.

After the deletion of the data from the memory cell in the desired deletion block is stopped, the operation signal SWE becomes "0". Further, at time t10, the operation signal SWE becomes "1" and at time t11, the write signal P becomes "1", whereby data write starts. At this moment, the voltage of the separation region NiSO is maintained to be Vdd and those of the p type wells PWL0 to PWL2 are maintained to be 0V. In addition, the source and drain regions 21 of each memory cell are maintained to be 0V, as well.

After a write operation is then carried out for a predetermined period of time, the write signal P becomes "0" and the write verification signal PV becomes "1" at time t12, whereby a verification operation starts. While this write verification signal PV is "1" (at t12 to t13), data (threshold voltage) determination is carried out.

If the data (threshold voltage) determination result is "OK", the operation signal SWE becomes "0" at time t14.

As can be understood, parasitic capacitances are generated between the p type wells PWL1 and PWL2 in which the unselected memory cells MC1 and MC2 are respectively formed and the separation region NiSO and between the separation region NiSO and the semiconductor substrate PSUB, respectively. Therefore, in the data deletion, it takes time to charge the parasitic capacitances and there is a limit to the shortening time to reach a deletion potential.

Furthermore as stated above, since all the memory cells in the remaining unselected deletion blocks are related to the parasitic capacitances for one selected deletion block, the capacity of the semiconductor memory becomes extremely large. In the semiconductor memory having the memory cells made smaller in size and realizing higher integration, in particular, the increase of time to reach the deletion potential caused by such parasitic capacitances becomes a serious problem.

Moreover, in the above-stated deletion verification operation, the charge and discharge of the parasitic capacitances are repeatedly carried out. Due to this, time required for the charge and discharge greatly causes the increase of the deletion time.

In this embodiment, therefore, the following configuration and deletion method are utilized.

Figure 1:
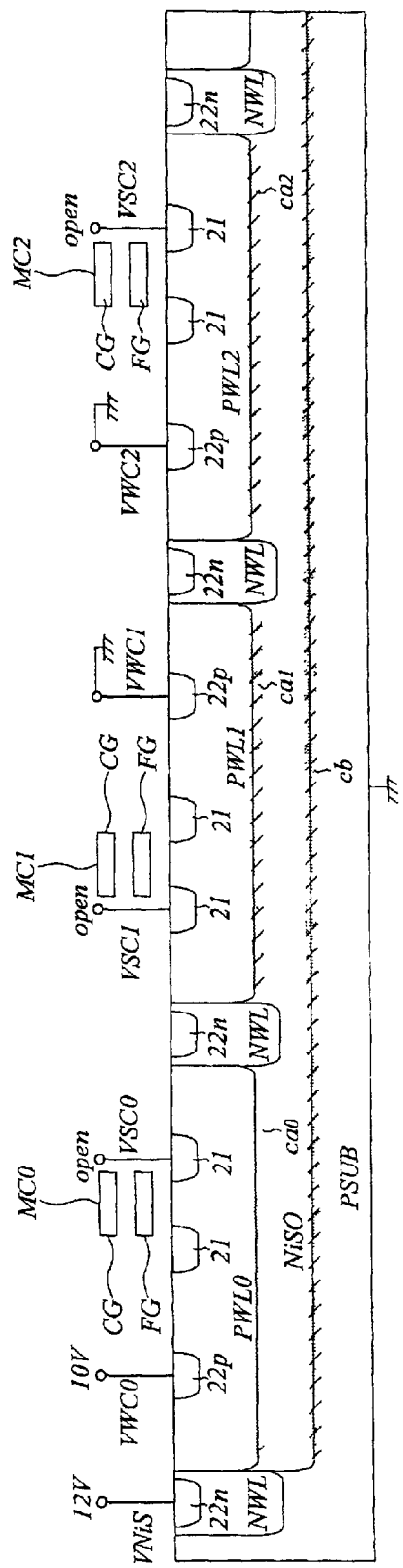
FIG. 1 shows voltages applied to p type wells and a separation region when data written to a flash memory in an embodiment according to the present invention is deleted from the flash memory.

FIG. 1 shows voltages applied to the p type well PWL1 and the separation region NiSO, respectively, when the data written to the flash memory in this embodiment is deleted. The configuration of each memory cell of this flash memory and the outline of the write, read and deletion operations thereof have been already described with reference to FIGS. 25 to 27. The important parts of the deletion operation related to this embodiment will only be, therefore, described herein.

In FIG. 1, the memory cell MC0 is a memory cell in the deletion block 0, the memory cell MC1 is a memory cell in the deletion block 1 and the memory cell MC2 is a memory cell in the deletion block 2. A voltage application state in a case where data written to the memory cells (MC0 or the like) in the deletion block 0 is deleted is shown in FIG. 1.

As shown in FIG. 1, a voltage of 12V is applied to the separation region NiSO through the n type well NWL. In addition, a voltage of 10V is applied to the p type well PWL0 in which the selected memory cell MC0 is formed, and the voltages of the p type wells PWL1 and PWL2 in which the unselected memory cells MC1 and MC2 are formed are maintained to be 0V, respectively. On the other hand, the voltage of the semiconductor substrate PSUB is maintained to be 0V. The source and drain regions 21 of each memory cell are open.

Figure 2:
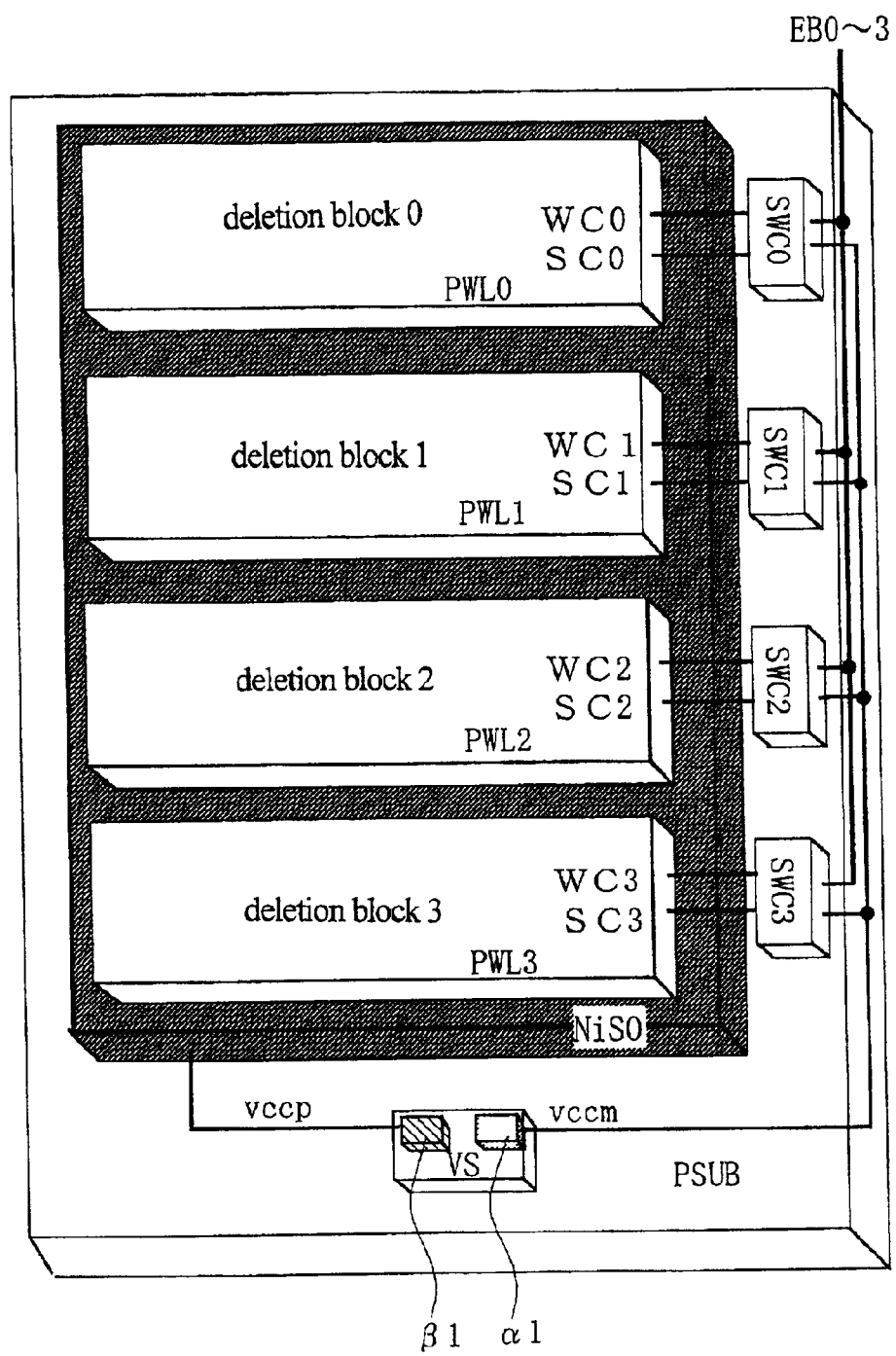
FIG. 2 shows the connection among the separation region, the p type wells and a voltage generation circuit.

Here, a voltage (vccm, 10V) is supplied to the p type well PWL0 in which the selected memory cell MC0 is formed, from a voltage generation circuit α1 and a voltage (vccp, 12V) is supplied to the separation region NiSO from a voltage generation circuit β1 (see FIG. 2).

FIG. 2 shows the connection among the separation region NiSO, the p type wells PWL0 to PWL3 and the voltage generation circuits α1 and β1. As shown in FIG. 2, the predetermined voltage (vccm, 10V) is supplied to the p type wells PWL0 to PWL3 from the voltage generation circuit α1 in the power supply circuit VS through the voltage control circuits SWC0 to SWC3, respectively, and the predetermined voltage (vccp, 12V) is supplied to the separation region NiSO from the voltage generation circuit β1 in the power supply circuit VS. Erasure block signals EB0 to EB3 are inputted into the voltage control circuits SWC0 to SWC3, respectively and one of the deletion blocks 0 to 3 (p type wells PWL0 to PWL3) is designated in accordance with the signals and the above-stated voltage is supplied to the designated deletion block.

As shown in FIG. 1, therefore, parasitic capacitances $Ca_1$ and $Ca_2$ generated between the p type wells PWL1 and 2 in which the unselected memory cells MC1 and MC2 are formed, and the separation region NiSO, respectively and a parasitic capacitance Cb generated between the separation region NiSO and the semiconductor substrate PSUB are charged, in advance, by the voltage generation circuit β1 which is different from the voltage generation circuit which charges the p type well PWL0 in which the selected memory cell MC0 is formed. Due to this, it suffices that the voltage generation circuit α1 charges the parasitic capacitance $Ca_0$ generated between the p type well PWL0 in which the selected memory cell MC0 is formed and the separation region NiSO, thereby making it possible to shorten time to reach the deletion potential.

Figure 3:
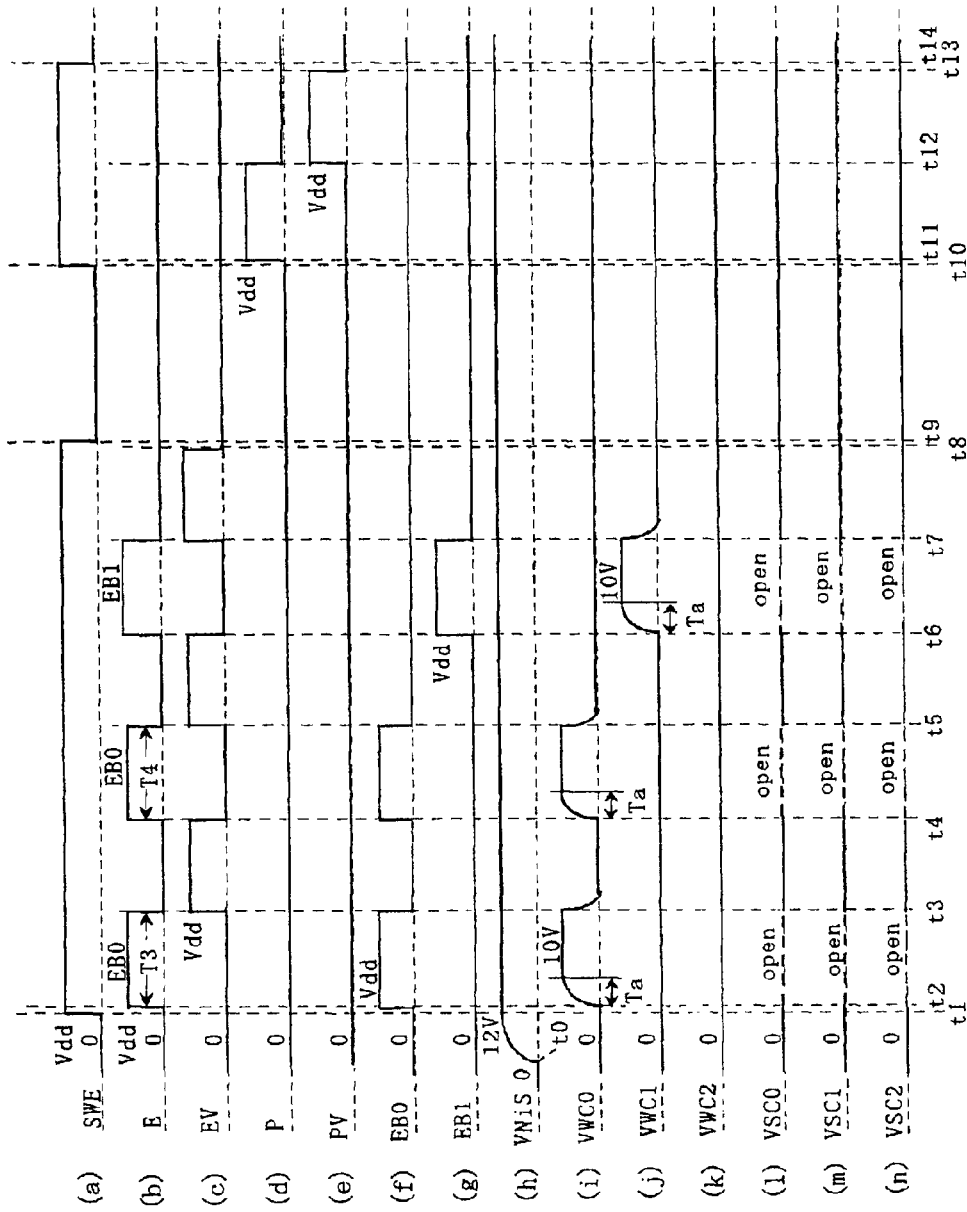
FIG. 3 is a timing chart showing the voltage changes of respective signals and sections during data deletion in an embodiment according to the present invention.

FIG. 3 is a timing chart showing the voltage changes of the respective signals and sections during the data deletion in this embodiment.

At time t0, the application of a voltage of 12V to the separation region NiSO starts. At time t1, the operation signal SWE becomes "1" and at time t2, the deletion signal E becomes "1" the deletion block signal EB0 becomes "1", whereby the deletion block 0 is designated and data deletion starts. At this moment, a voltage of 10V is applied to the p type well PWL0 in which the selected memory cell MC0 is formed.

At time t1, however, the voltage of the separation region NiSO is raised to 12V as indicated by (h) of FIG. 3. Due to this, it suffices that the voltage generation circuit al raises the voltage of the p type well PWL0 to 10V (charges the parasitic capacitance $Ca_0$). As indicated by (i) of FIG. 3, it is possible to shorten time Ta (Ta<Tz) required until the voltage (VWC0) of the p type well PWL0 becomes a desired voltage.

Even if the voltage of the separation region NiSO starts rising at time t1, voltages are applied to the separation region NiSO and the p type well PWL0 from the different voltage generation circuits (α1 and β1), respectively. It is, therefore, possible to shorten time required until the voltage (VNiS) of the separation region NiSO and the voltage (VWC0) of the p type well PWL0 become desired voltages, respectively.

After a deletion operation is then carried out for a predetermined period, the deletion signal E becomes "0" and the deletion verification signal EV becomes "1" at time t3, whereby a verification operation starts. While this deletion verification signal EV is "1" (at t3 to t4), data (threshold voltage) determination is carried out. At this moment, the voltage of the p type well PWL0 in which the selected memory cell MC0 is formed is maintained to be 0V.

Next, at time t4, the deletion signal E becomes "1" and the deletion verification signal EV becomes "0", whereby re-deletion of data starts. At this moment, the voltage of the p type well PWL0 in which the selected memory cell MC0 is formed is raised to 10V.

At time t4, however, the voltage of the separation region NiSO is raised to 12V as indicated by (h) of FIG. 3. Due to this, it suffices that the voltage generation circuit α1 raises the voltage of the p type well PWL0 to 10V. As indicated by (i) of FIG. 3, it is possible to shorten time Ta (Ta<Tz) required until the voltage (VWC0) of the p type well PWL0 becomes a desired voltage.

After a deletion operation is then carried out for a predetermined time, the deletion signal E becomes "0" and the deletion verification signal EV becomes "1" at time t5, whereby a verification operation starts. While this deletion verification signal EV is "1" (at t5 to t6), data (threshold voltage) determination is carried out. At this moment, the voltage of the p type well PWL0 is maintained to be 0V.

Next, if the data (threshold voltage) determination result is "OK", the deletion signal E becomes "1" and the deletion block signal EB1 becomes "1" at time t6, whereby the deletion block 1 is designated and data deletion starts. At this moment, too, since the voltage of the separation region NiSO is raised to 12V as indicated by (h) of FIG. 3, it suffices that the voltage generation circuit α1 raises the voltage of the p type well PWL1 to 10V. As indicated by (i) of FIG. 3, it is possible to shorten time Ta (Ta<Tz) required until the voltage (VWC1) of the p type well PWL1 becomes a desired voltage.

After a deletion operation is then carried out for a predetermined time, a verification operation starts (at time t7 to t8) as in the case of the deletion block signal EB0.

During the above-stated periods (t1 to t8), in the periods (t2 to t3, t4 to t5, and t6 to t7) in which deletion and re-deletion are carried out, the source and drain regions 21 of each memory cell are maintained to be open.

After the deletion of the data from the memory cell in the desired deletion block is stopped, the operation signal SWE becomes "0". Thereafter, at time t10, the operation signal SWE becomes "1" and at time t11, the write signal P becomes "1", whereby data write starts. At this moment, the voltage of the separation region NiSO is maintained to be 12V and those of the p type wells PWL0 to PWL2 are maintained to be 0V, respectively. In addition, the source and drain regions 21 of each memory cell are maintained to be 0V, respectively.

After a write operation is then carried out for a predetermined period, the write signal P becomes "0 " and the write verification signal PV becomes "1" at time t12, whereby a verification operation starts. While this write verification signal PV is "1" (at t12 to t13), data (threshold voltage) determination is carried out.

If the data (threshold voltage) determination result is "OK", the operation signal SWE becomes "0" at time t14.

As can be seen, according to this embodiment, voltages are supplied to the separation region NiSO and the p type well in which the selected memory cell is formed (the p type well in the designated deletion block) from the different voltage generation circuits (α1 and β1), respectively. It is, therefore, possible to shorten time required until the voltage of the p type well in which the selected memory cell is formed becomes a desired voltage.

Figure 4:
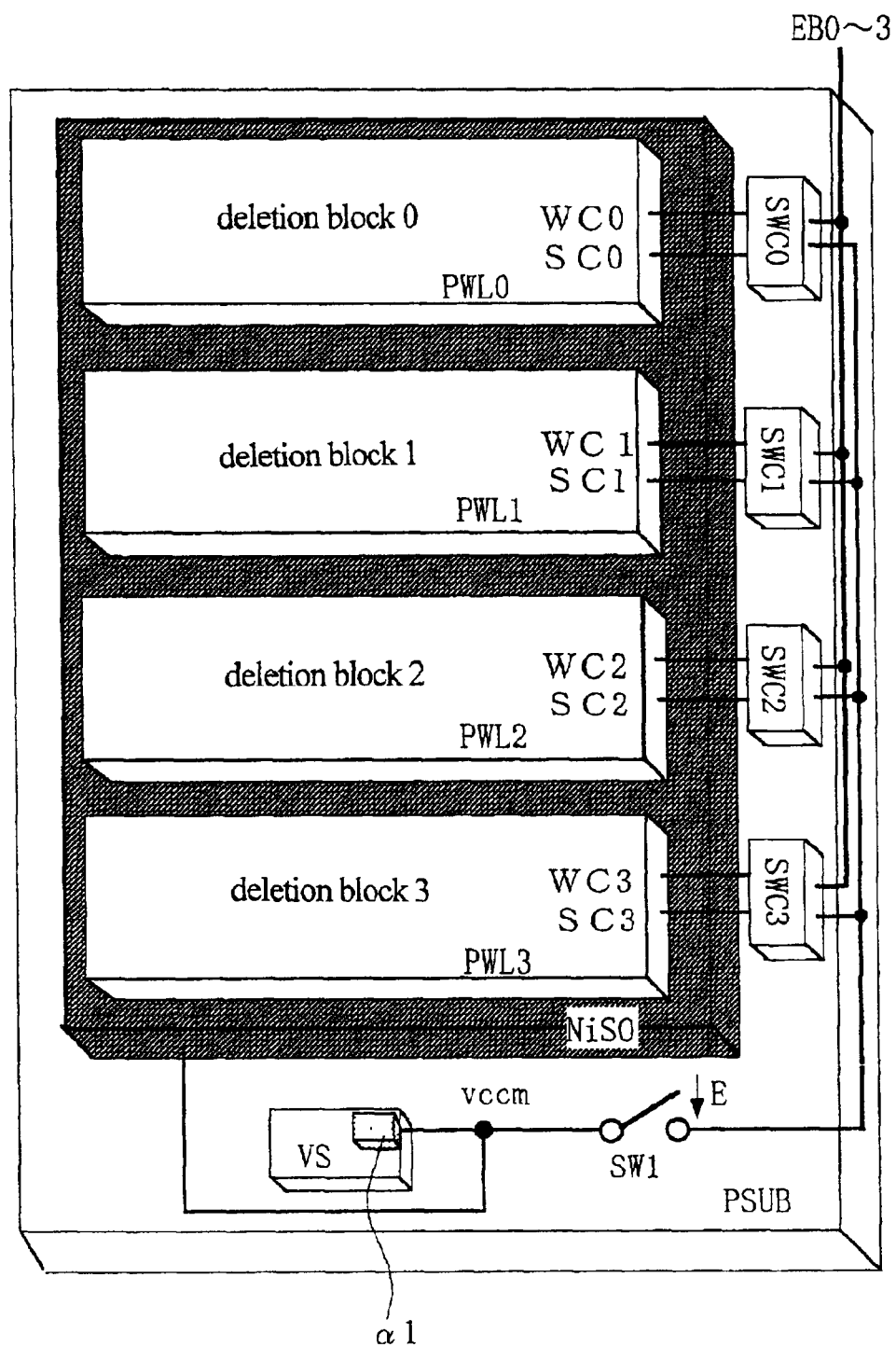
FIG. 4 shows the connection among the separation region, the p type wells and the voltage generation circuit.

In this embodiment, a voltage of 12V is applied to the separation region NiSO. It suffices the voltage, e.g., 10V, equal to or higher than the voltage applied to the p type well in which the selected memory cell is formed is applied to the separation region NiSO. Therefore, as shown in FIG. 4, a voltage of 10V from the voltage generation circuits α1 may be supplied to the separation region NiSO and the p type well in which the selected memory cell is formed, respectively and the application of voltages to the p type wells PWL0 to PWL3 may be controlled by a switch Sw1.

Second Embodiment

Figure 5:
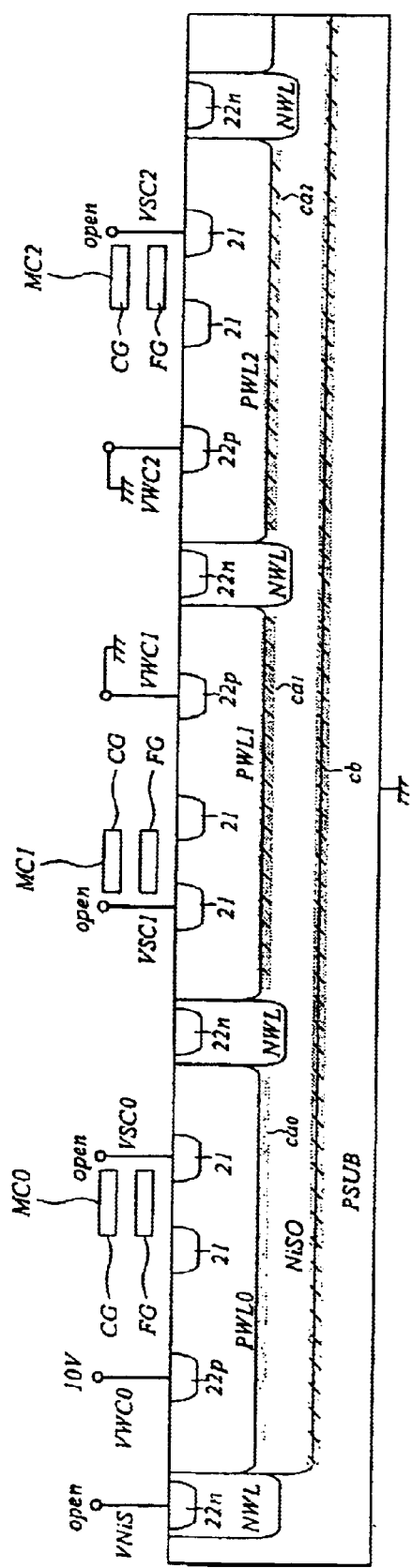
FIG. 5 shows voltages applied to the p type wells and separation region when data written to a flash memory in an embodiment according to the present invention is deleted.

FIG. 5 shows voltages applied to p type wells and a separation regions NiSO, respectively when data written to a flash memory in the second embodiment is deleted. Since the configuration of each memory cell of this flash memory and outlines of the write, read and deletion operations thereof have been already described with reference to FIGS. 25 to 27 in the first embodiment, only the important parts of the deletion operation related to this embodiment will be described herein.

In FIG. 5, the memory cell MC0 is a memory cell in the deletion block 0, the memory cell MC1 is a memory cell in the deletion block 1 and the memory cell MC2 is a memory cell in the deletion block 2. A voltage application state in a case where data written to the memory cells (MC0 and the like) in the deletion block 0 is deleted is shown in FIG. 5.

As shown in FIG. 5, a voltage of 10V is applied to the p type well PWL0 in which the selected memory cell MC0 is formed, and the voltages of the p type wells PWL1 and PWL2 in which the unselected memory cells MC1 and MC2 are formed are maintained to be 0V, respectively. In addition, the separation region NiSO is open. On the other hand, the voltage of the semiconductor substrate PSUB is maintained to be 0V. The source and drain regions of each memory cell are open.

Here, a voltage (vccm, 10V) is supplied to the p type well PWL0 in which the selected memory cell MC0 is formed, from a power supply circuit VS (see FIG. 6) and the voltage of the separation region NiSO is raised to 10V through the p type well PWL0 as will be described later.

Figure 6:
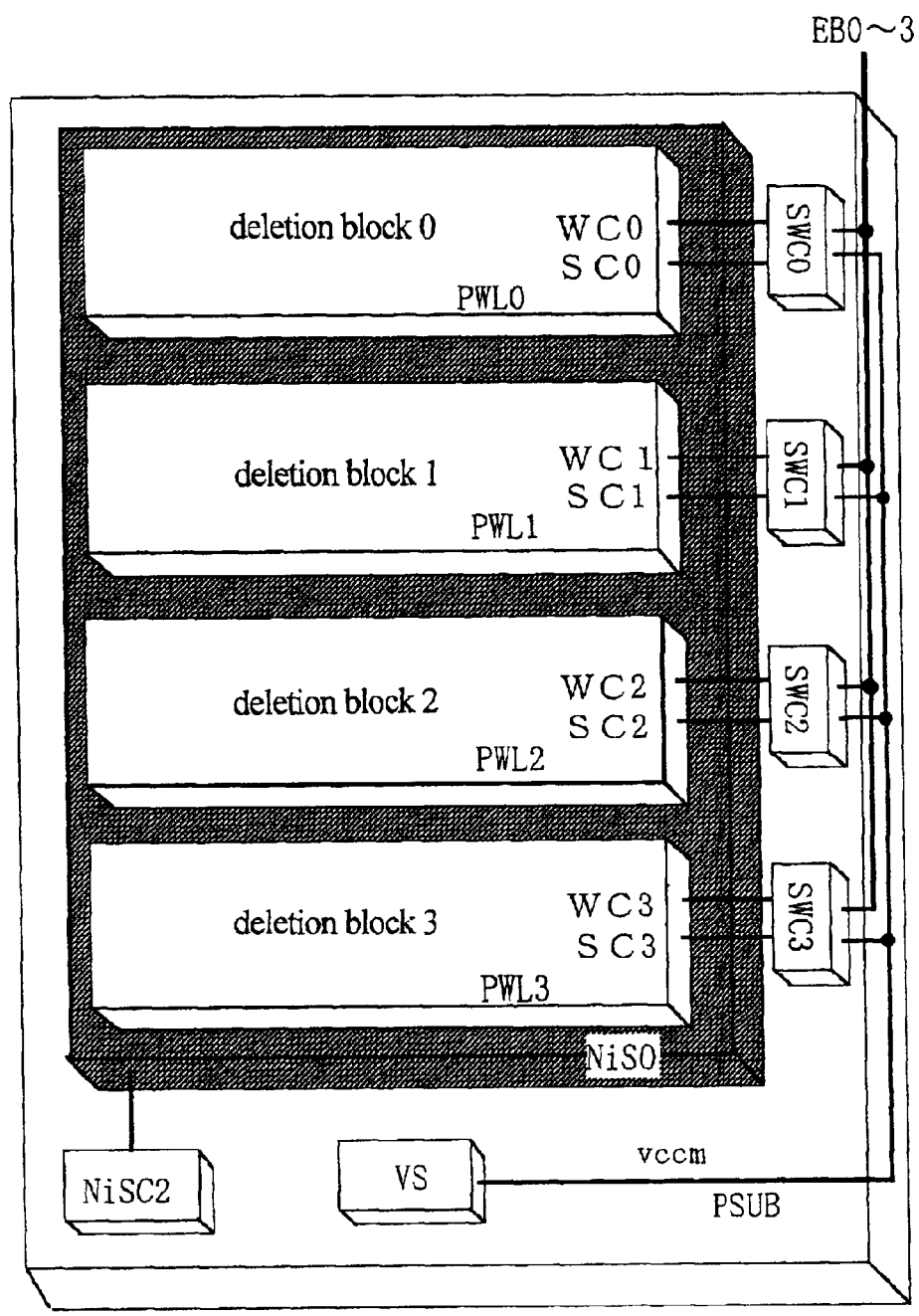
FIG. 6 shows the connection among the separation region and the p type wells, control circuits and a power supply circuit.

FIG. 6 shows the connection among the separation region NiSO, the p type wells PWL0 to PWL3 and the power supply circuit VS. As shown in FIG. 6, the predetermined voltage (vccm, 10V) is supplied to the p type wells PWL0 to PWL3 from a voltage generation circuit in the power supply circuit VS through voltage control circuits SWC0 to SWC3, respectively. In addition, the separation region NiSO is maintained open (in a state in which the application of a voltage to the region NiSO is prohibited) by a control circuit NiSC2 during data deletion. Erasure block signals EB0 to EB3 are inputted into the voltage control circuits SWC0 to SWC3, respectively, any one of the deletion blocks 0 to 3 (p type wells PWL0 to PWL3) is designated in accordance with the signals and the above-stated voltage is supplied to the designated block.

Here, as already described with reference to FIG. 5, parasitic capacitances $Ca_1$ and $Ca_2$ are generated between the p type wells PWL1 and PWL2 in which the unselected memory cells MC1 and MC2 are formed and the separation region NiSO, respectively, and a parasitic capacitance Cb is generated between the separation region NiSO and the semiconductor substrate PSUB.

Accordingly, it takes certain time for the voltage (VNiS) of the separation region NiSO and the voltage (VMC0) of the p type well PWL0 to become 10V, respectively. In this case, a current to the separation region NiSO in a forward direction by the voltage of the p type well PWL0 and the potential of the separation region NiSO becomes a voltage supplied to the p type well PWL0.

However, once the parasitic capacitances $Ca_1$, $Ca_2$ and Cb are charged, the separation region NISO is maintained open. Due to this, even if the voltage of the p type well PWL0 is set at 0V, the potential of the separation region NiSO becomes opposite in direction and no current is carried to the separation region NiSO, so that the voltages of the parasitic capacitances $Ca_1$, $Ca_2$ and Cb are maintained to be 10V, respectively. As a result, in the second and the following deletion operations, it suffices to charge only the parasitic capacitance $Ca_0$ generated between the p type well PWL0 and the separation region NiSO, making it possible to shorten deletion time.

Figure 7:
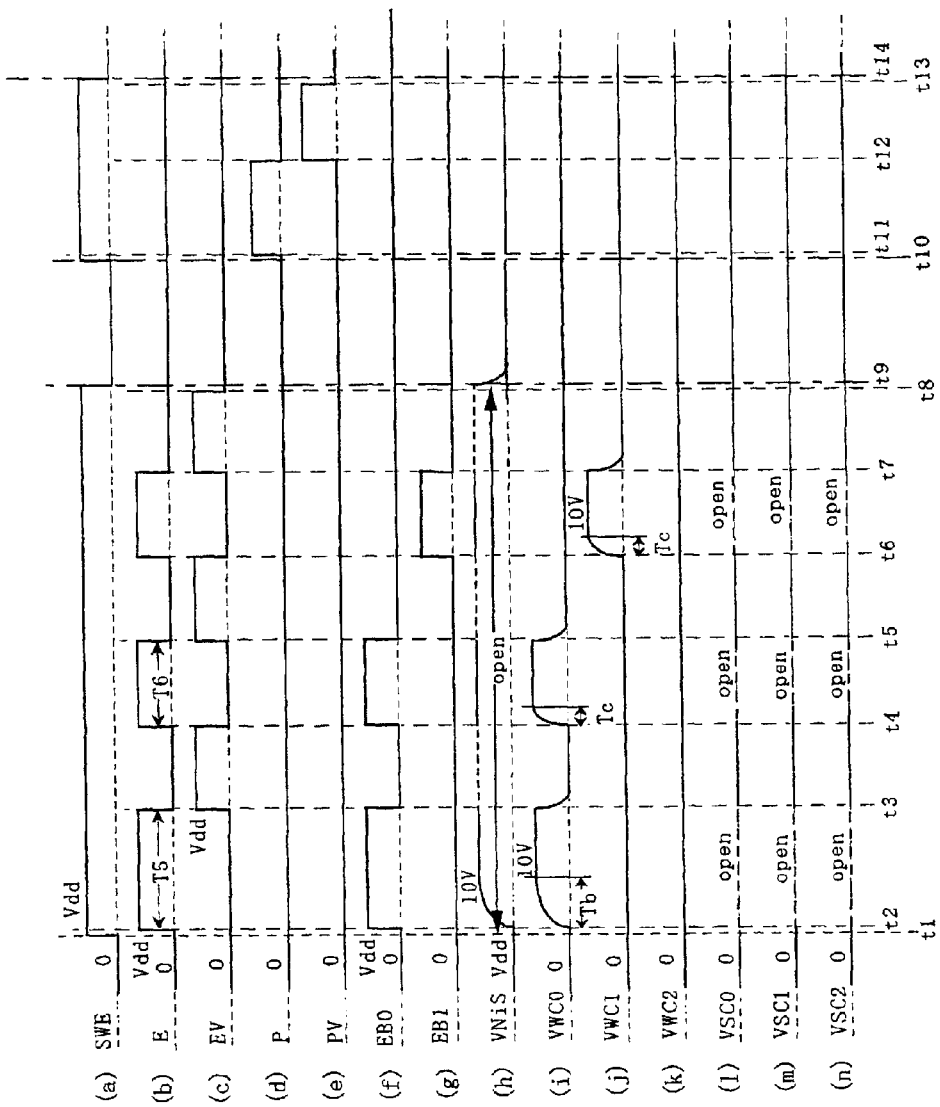
FIG. 7 is a timing chart showing the voltage changes of respective signals and sections during data deletion in an embodiment according to the present invention.

FIG. 7 is a timing chart showing the voltage changes of respective signals and sections during data deletion in this embodiment.

At time t1, an operation signal SWE becomes "1" and at time t2, a deletion signal E becomes "1" and a deletion block signal EB0 becomes "1", whereby the deletion block 0 is designated and data deletion starts. At this moment, a voltage of 10V is applied to the p type well PWL0 in which the selected memory cell MC0 is formed and the voltage of the separation region NiSO is thereby raised to 10V. As indicated by (h) and (i) of FIG. 7, it takes time Tb for the voltage (VNiS) of the separation region NiSO and the voltage (VWC0) of the p type well PWL0 to become 10V, respectively. As indicated by (h) of FIG. 7, the separation region NiSO is maintained open after time t1 until time t9 to be described later.

After a deletion operation is then carried out for a predetermined period, the deletion signal E becomes 0 and the deletion verification signal EV becomes "1" at time t3, whereby a verification operation starts. While this deletion verification signal EV is "1" (at t3 to t4), data (threshold voltage) determination is carried out. At this moment, the voltage of the p type well PWL0 in which the selected memory cell MC0 is formed is maintained to be 0V. The separation region NiSO is maintained open.

Next, at time t4, the deletion signal E becomes "1" and the deletion verification signal EV becomes "0", whereby re-deletion starts.

Since the voltage of the separation region NiSO is raised in the first deletion period (t2 to t3) and the separation region NiSO is maintained open, the separation region NiSO can be maintained to have almost a potential of 10V at time t4 as stated above. As a result, it suffices that the voltage generation circuit raises the p type well PWL0 to 10V. As indicated by (i) of FIG. 7, it is possible to shorten time Tc (Tc<Tb≈Tz) required until the voltage (VWC0) of the p type well PWL0 becomes a desired voltage.

After a deletion operation is then carried out for a predetermined period, the deletion signal E becomes "0" and the deletion verification signal EV becomes "1" at time t5, whereby a verification operation starts. While this deletion verification signal EV is "1" (at t5 to t6), data (threshold voltage) determination is carried out. At this moment, the voltage of the p type well PWL0 is maintained to be 0V and the separation region NiSO is maintained to be open.

Next, if the data (threshold voltage) determination result is "OK", the deletion signal E becomes "1" and the deletion block signal EB1 becomes "1" at time t6, whereby the deletion block 1 is designated and data deletion starts. At this moment, a voltage of 10V is applied to the p type well PWL1 in which the selected memory cell MC1 is formed. However, since the voltage of the separation region NiSO is raised in the first deletion period (t2 to t3) and maintained at time t6, it suffices that the voltage generation circuit raises the voltage of the P type well PWL1 to 10V. As indicated by (i) of FIG. 7, it is possible to shorten time Tc (Tc<Tb) required until the voltage (VWC1) of the p type well PWL1 becomes a desired voltage.

After a deletion operation is then carried out for a predetermined period, a verification operation starts as in the case of the deletion block signal EB0 (t7 to t8).

During the above-stated periods (t1 to t8), in the periods (t2 to t3, t4 to t5 and t6 to t7) in which deletion and re-deletion are carried out, the source and drain regions 21 of each memory cell are maintained to be open.

After the deletion of the data from the memory cell in the desired deletion block is stopped, the operation signal SWE becomes "0". Then, the operation signal SWE becomes "1" at time t10 and the write signal P becomes "1" at time t11, whereby data write starts. At this moment, the voltage of the separation region NiSO is maintained to be Vdd and those of the p type wells PWL0 to PWL2 are maintained to be 0V, respectively. The source and drain regions 21 of each memory cell are maintained to be 0V.

After a write operation is then carried out for a predetermined time, a write signal P becomes "0" and a write verification signal PV becomes "1" at time t12, whereby a verification operation starts. While this write verification signal PV is "1" (at t12 to t13), data (threshold voltage) determination is carried out.

If the data (threshold voltage) determination result is "OK", the operation signal SWE becomes "0" at time t14.

As can be understood from the above, according to this embodiment, the separation region NiSO is maintained to be open during the deletion periods of t1 to t9. It is, therefore, possible to shorten time Tc required until the voltage of the p type well in which the selected memory cell is formed becomes a desired voltage in the second and the following deletion operations.

Third Embodiment

Figure 8:
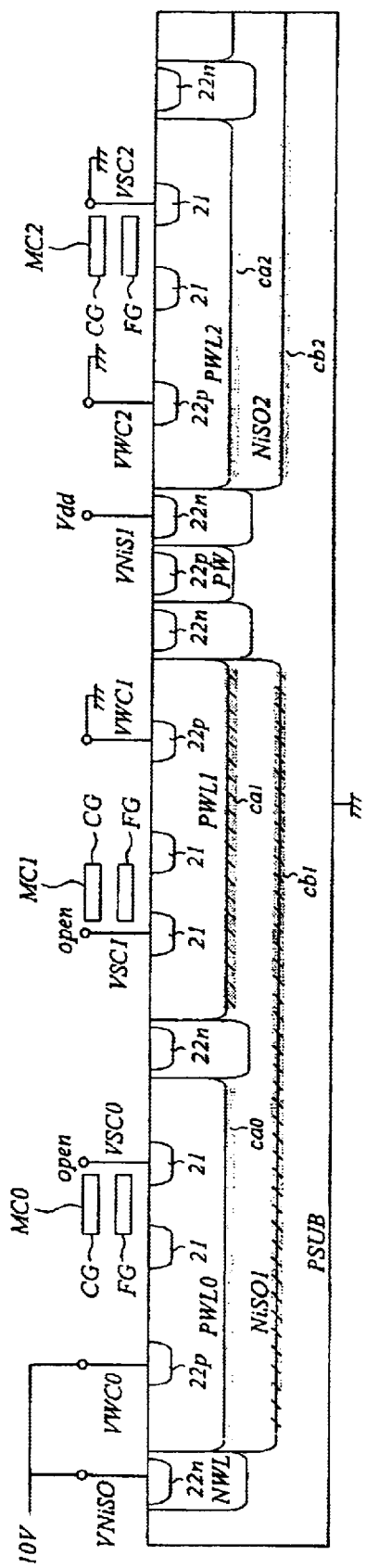
FIG. 8 shows voltages applied to p type wells and separation regions when data written to a flash memory in an embodiment according to the present invention is deleted.

FIG. 8 shows the configuration of a flash memory in the third embodiment and a voltage application state during data deletion. Since the configuration of each memory cell of this flash memory and the outlines of the write, read and deletion operations thereof are overlapped with the description given with reference to FIGS. 25 to 27 in the first embodiment, only the important parts of the configuration of the flash memory and the deletion operation related to this embodiment will be described.

In respect of the configuration of the flash memory, a separation region NiSO1, which is formed of an n type semiconductor region, is formed between p type wells PWL0 and PWL1 and the semiconductor substrate PSUB as shown in FIG. 8. In addition, a separation region NiSO2, which is formed of an n type semiconductor region, is formed between the p type well PWL2 and the semiconductor substrate PSUB. Further, a p type well PW is formed between the separation regions NiSO1 and NiSO2.

As can be seen, divided separation regions NiSO's are formed at the intervals of some p type wells PWL's (deletion blocks).

In FIG. 8, the memory cell MC0 is a memory cell in the deletion block 0, the memory cell MC1 is a memory cell in the deletion block 1 and the memory cell MC2 is a memory cell in the deletion block 2. A voltage application state in a case where data written to memory cells (MC0 and the like) in the deletion block 0 is deleted is shown in FIG. 8.

As shown in FIG. 8, a voltage of 10V is applied to the p type well PWL0 in which the selected memory cell MC0 is formed and to the separation region NiSO1 under the p type well PWL0, respectively, and the voltages of the p type wells PWL1 and PWL2 in which the unselected memory cells MC1 and MC2 are formed, are maintained to be 0V, respectively. The voltage of the semiconductor substrate PSUB is maintained to be 0V. The source and drain regions of each memory cell on the same separation region NiSO as that of the selected memory cell (designated deletion block) are maintained to be open, respectively. In addition, the source and drain regions of each memory cell on the other separation region NiSO are maintained to be 0V, respectively.

Figure 9:
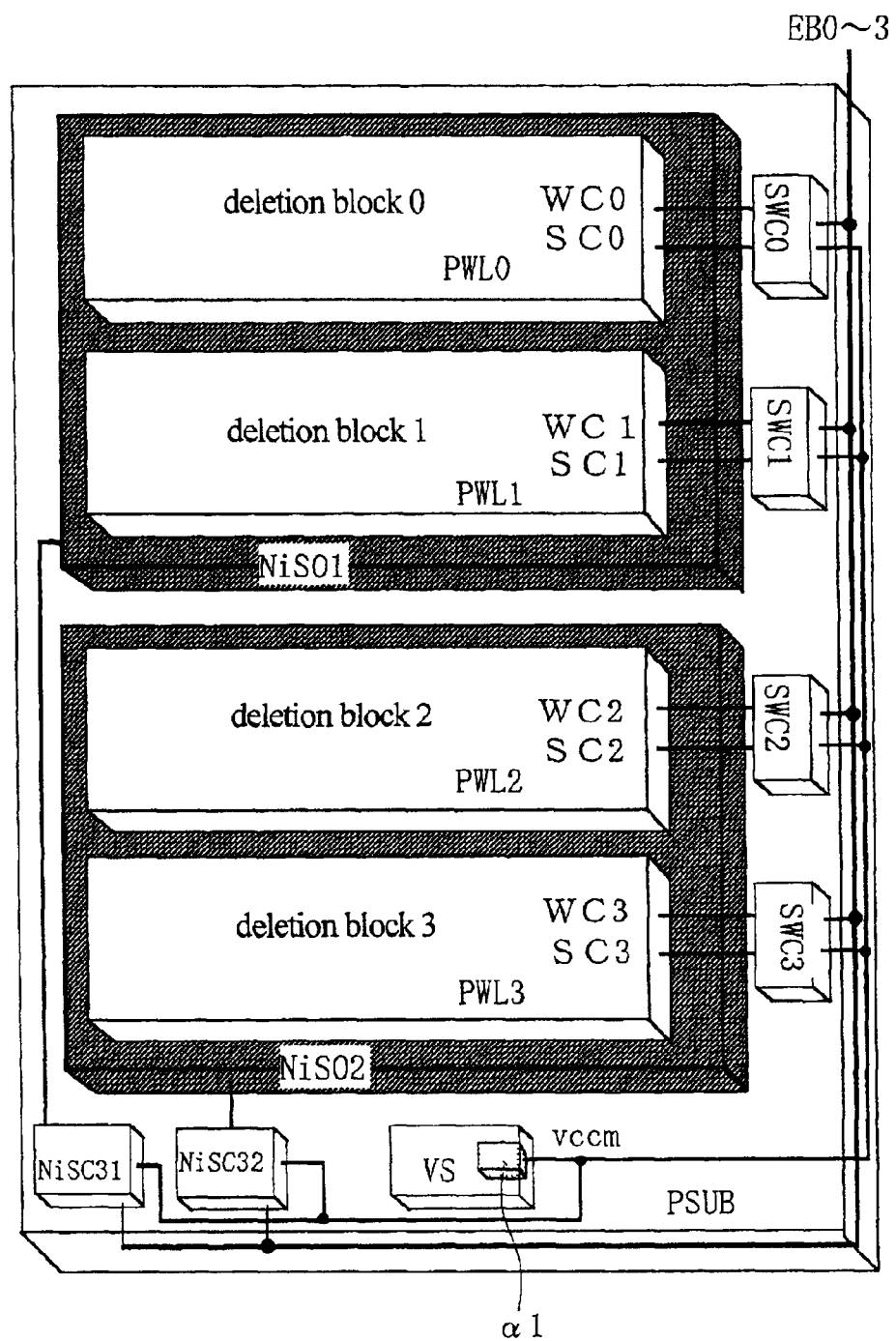
FIG. 9 shows the connection among the separation regions and the p type wells, control circuits and a power supply circuit.

Here, a voltage (vccm, 10V) is supplied to the p type well PWL0 in which the selected memory cell MC0 is formed and the separation region NiSO1 from a voltage generation circuit α1, respectively (see FIG. 9).

FIG. 9 shows the division states of the separation region NiSO and the connection between the separation regions NiSO's and the voltage generation circuit α1. As shown in FIG. 9, the separation region NiSO is divided at the intervals of two deletion blocks and the respective separation regions NiSO1 and NiSO2 are connected to the voltage generation circuit α1 through control circuits NiSC31 and NiSC32, respectively. In addition, deletion block signals EB0 to EB3 are inputted into the control circuits NiSC31 and NiSC32, respectively and a voltage is supplied from the voltage generation circuit α1 to the separation region NiSO1 or NiSO2 under the designated deletion block.

Further, the voltage generation circuit α1 is connected to the p type wells PWL0 to PWWL3 through voltage control circuits SWC0 to SWC3, respectively. Erasure block signals EB0 to EB3 are inputted into the voltage control circuit SWC0 to SWC3, respectively, any one of the deletion blocks 0 to 3 (p type wells PWL0 to PWL3) is designated in accordance with the signals and a voltage is supplied to the designated block from the voltage generation circuit α1.

Here, as shown in FIG. 8, a parasitic capacitance $Ca_1$ generated between the p type well PWL1 in which the unselected memory cell MC1 is formed and the separation region NiSO1 and a parasitic capacitance $Cb_1$ generated between the separation region NiSO1 and the semiconductor substrate PSUB are charged by the voltage generation circuit α1.

When the data written to the memory cells (MC0 and the like) in the deletion block 0 is deleted, a parasitic capacitance $Ca_2$ and a parasitic capacitance $Cb_2$ are not generated between the p type well PWL1 in which the unselected memory cell MC2 is formed and the separation region NiSO2 and between the separation region NiSO2 and the semiconductor substrate PSUB, respectively. It is, therefore, possible to shorten deletion time.

Figure 10:
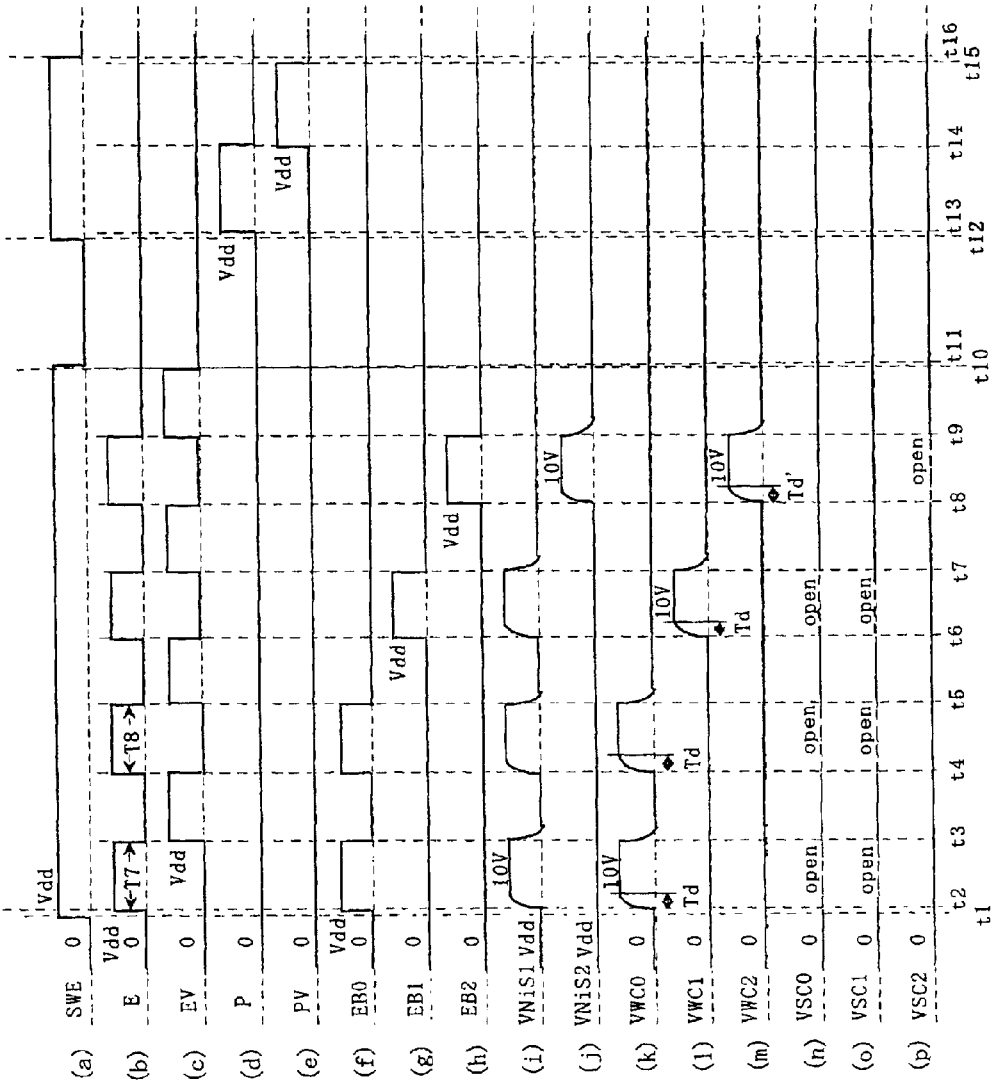
FIG. 10 is a timing chart showing the voltage changes of respective signals and sections during data deletion in an embodiment according to the present invention.

FIG. 10 is a timing chart showing the voltage changes of respective signals and sections during data deletion in this embodiment.

At time t1, an operation signal SWE becomes "1", at time t2, a deletion signal E becomes "1" and a deletion block signal EB0 becomes "1", whereby the deletion block 0 is designated and data deletion starts. At this moment, a voltage of 10V is applied to the separation region NiSO1 and the p type well PWL0 in which the selected memory cell MC0 is formed, respectively. As indicated by (i) and (k) of FIG. 10, it takes time Td (Td<Tz) for the voltage (VNiS1) of the separation region NiSO1 and the voltage (VWC0) of the p type well PWL0 to become 10V, respectively.

However, since the separation region is divided at the intervals of two deletion blocks, it is possible to reduce a parasitic capacitance generated by the separation region NiSO1. As a result, deletion time can be shortened.

After a deletion operation is then carried out for a predetermined period, the deletion signal E becomes "0" and a deletion verification signal EV becomes "1" at time t3, whereby a verification operation starts. While this deletion verification signal EV is "1" (at t3 and t4), data (threshold voltage) determination is carried out. At this moment, the voltages of the separation region NiSO and the p type well PWL0 in which the selected memory cell MC0 is formed are maintained to be 0V, respectively.

Next, at time t4, the deletion signal E becomes "1", the deletion verification signal EV becomes "0" and the deletion block signal EB0 becomes "1", whereby data deletion starts again. At this moment, too, a voltage of 10V is respectively applied to the separation region NiSO1 and the p type well PWL0 in which the selected memory cell MC0 is formed. As indicated by (i) and (k) of FIG. 10, it suffices to take time Td until the voltage (VNiS1) of the separation region NiSO1 and the voltage (VWC0) of the p type well PWL0 become 10V, respectively. In this case, too, since the parasitic capacitances $Ca_1$ and $Cb_1$ are reduced, deletion time is shortened.

After a deletion operation is then carried out for a predetermined time, the deletion signal E becomes "0" and the deletion verification signal EV becomes "1" at time t5, whereby a verification operation starts. While this deletion verification signal EV is "1" (at t5 to t6), data (threshold voltage) determination is carried out. At this moment, the voltages of the separation region NiSO1 and the p type well PWL0 in which the selected memory cell MC0 is formed are maintained to be 0V, respectively.

If the data (voltage threshold) determination result is "OK", the deletion signal E becomes "1" and the deletion block signal EB1 becomes "1" at time t6, whereby the deletion block 1 is designated and data deletion starts. At this moment, a voltage of 10V is respectively applied to the separation region NiSO1 and the p type well PWL1 in which the selected memory cell MC1 is formed. As indicated by (i) and (l) of FIG. 10, it suffices to take time Td until the voltage (VNiS1) of the separation region NiSO1 and the voltage (VWC1) of the p type well PWL1 become 10V, respectively.

After a deletion operation is then carried out for a predetermined period, a verification operation starts (at time t7) as in the case of the deletion block signal EB0. If data (threshold voltage) determination result is "OK", the deletion signal E becomes "1" and the deletion block signal EB2 becomes "1" at time t8, whereby the deletion block 2 is designated and data deletion starts. At this moment, a voltage of 10V is respectively applied to the separation region NiSO2 and the p type well PWL2 in which the selected memory cell MC2 is formed. As indicated by (j) and (m) of FIG. 10, it suffices to take time Td' until the voltage (VNiS2) of the separation region NiSO2 and the voltage (VWC2) of the p type well PWL2 become 10V, respectively.

That is, in this case as in the case of the above, it suffices that a parasitic capacitance generated between the p type well in which an unselected memory cell is formed, which is not shown, and the separation region NiSO2 and a parasitic capacitance $Cb_2$ generated between the separation region NiSO2 and the semiconductor substrate PSUB are charged. It is, therefore, possible to shorten deletion time.

After a deletion operation is then carried out for a predetermined time, a verification operation starts (at time t9) as in the case of the deletion block signal EB0.

During the above-stated periods (t1 to t9), in the periods (t2 to t3, t4 to t5, t6 to t7 and t8 to t9) in which data deletion and re-deletion are carried out, the source and drain regions 21 of each memory cells formed on the same separation region are maintained to be open, respectively.

After the deletion of the data from the memory cells in the desired deletion block is stopped, the operation signal SWE becomes "0". Thereafter, at time t12, the operation signal SWE becomes "1" and at time t13, a write signal P becomes "1", whereby data write starts. At this moment, the voltages of the separation regions NiSO1 and NiSO2 are maintained to be Vdd and those of the p type wells PWL0 to PWL2 are maintained to be 0V, respectively. In addition, the source and drain regions 21 of each memory cell are maintained to be 0V, respectively.

After a write operation is then carried out for a predetermined period, the write signal P becomes "0" and a write verification signal PV becomes "1" at time t14, whereby a verification operation starts. While this write verification signal PV is "1" (at t14 to t15), data (threshold voltage) determination is carried out.

If the data (threshold voltage) determination result is "OK", the operation signal SWE becomes "0" at time t16.

As can be understood from the above, according to this embodiment, the separation region NiSO is divided at the intervals of predetermined units of deletion blocks and the voltage of the separation region NiSO corresponding to the designated deletion block is raised. It is, therefore, possible to reduce parasitic capacitance. As a result, it is possible to shorten deletion time.

The division units of the separation region NiSO will next be described with reference to FIG. 11.

Figure 11:
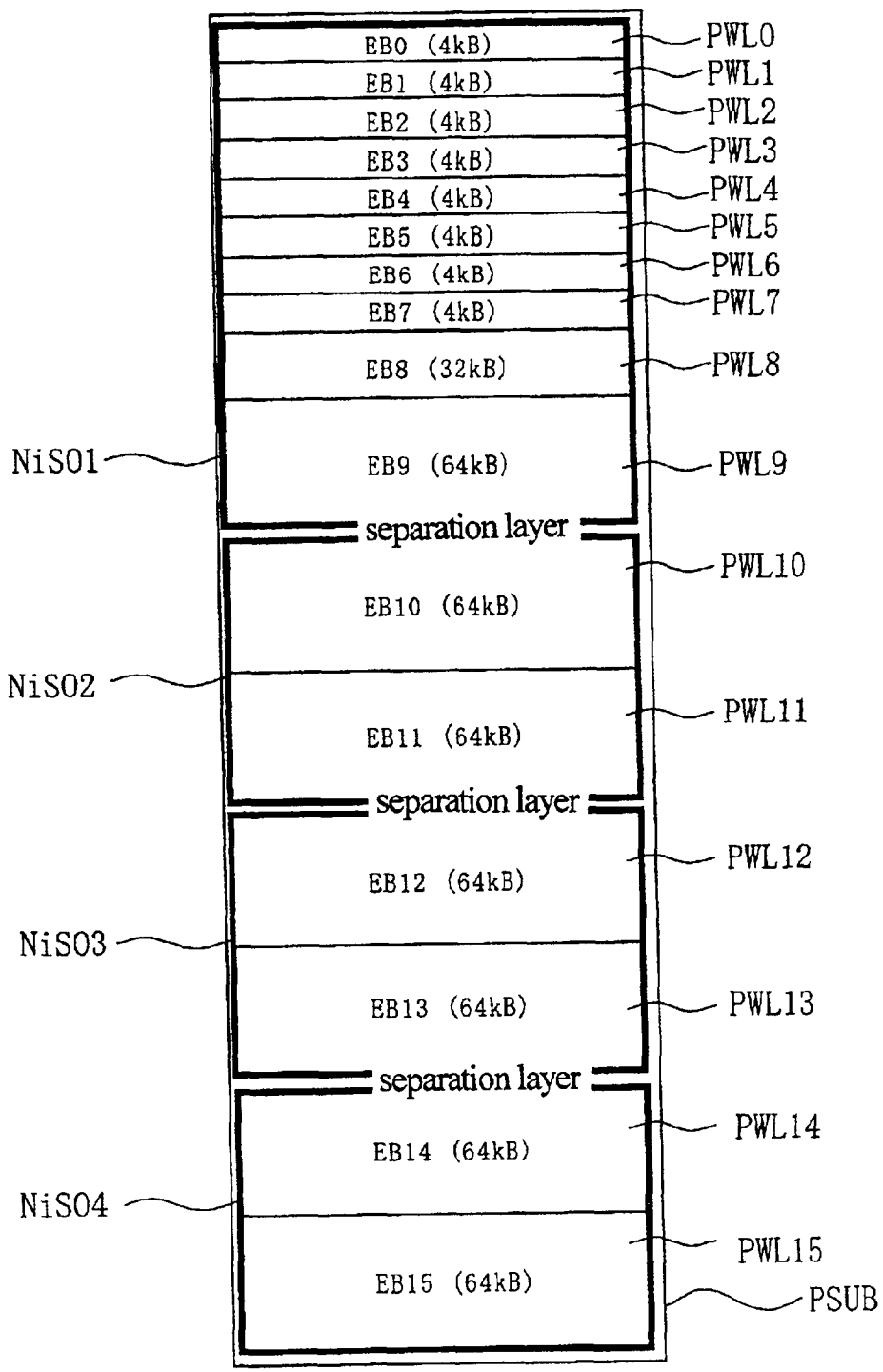
FIG. 11 shows the connection between the deletion blocks and the separation regions of the flash memory in an embodiment according to the present invention.

As shown in FIG. 11, if there exist, for example, deletion blocks EB0 to EB15 (the capacities of the deletion blocks EB0 to EB7 are 4 kB, that of the deletion block EB8 is 32 kB and those of the deletion blocks EB9 to EB15 are 64 kB, respectively), the memory cells in these blocks are formed on the p type wells PWL0 to PWL15, respectively. The separation region can be divided into separation regions NiSO1 to NiSO4 at the intervals of, for example, 128 kB for the deletion blocks EB0 to EB15.

Figure 12:
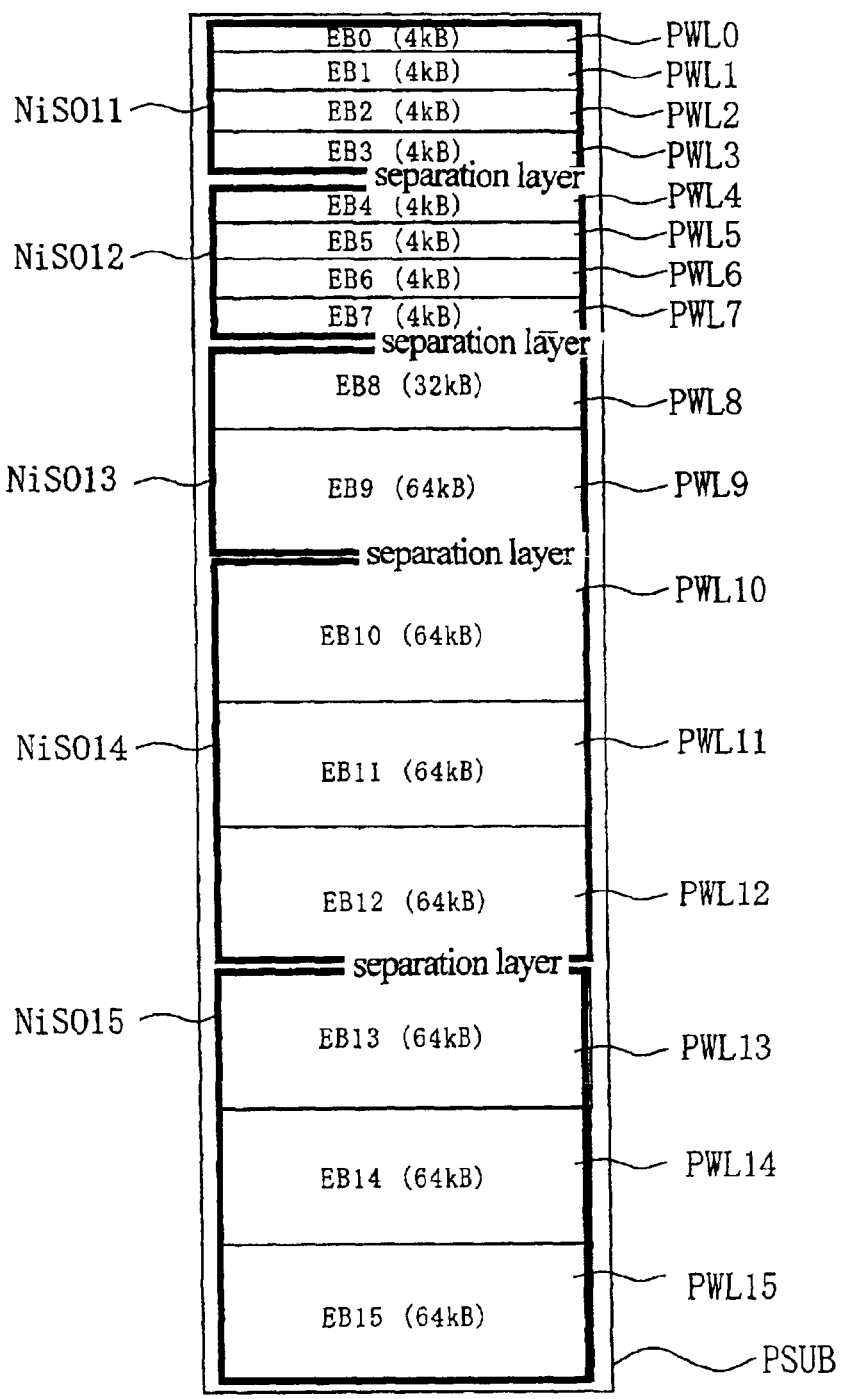
FIG. 12 shows the connection between the deletion blocks and the separation regions of the flash memory in an embodiment according to the present invention.

Further, as shown in FIG. 12, the separation region can be divided into separation regions NiSO11 and NiSO12 at the intervals of 16 kB for the deletion blocks each having a small memory capacity, e.g., the deletion blocks EB0 to EB7 each of a memory capacity of 4 kB, and the separation region can be divided into separation regions NiSO14 and NiSO15 at the intervals of 192 kB for the deletion blocks each having a large memory capacity, e.g., the deletion blocks EB10 to EB15 each of a memory capacity of 64 kB. It is noted that a separation region NiSO13 corresponds to deletion blocks (EB8 and EB9) having a memory capacity of 96 kB.

Data to be deleted many times is often stored in the deletion block having a small memory capacity, and the number of divided separation regions from the region NiSO is set high for the deletion blocks which store data to be deletion many times, thereby making it possible to further shorten the deletion time.

Fourth Embodiment

Figure 13:
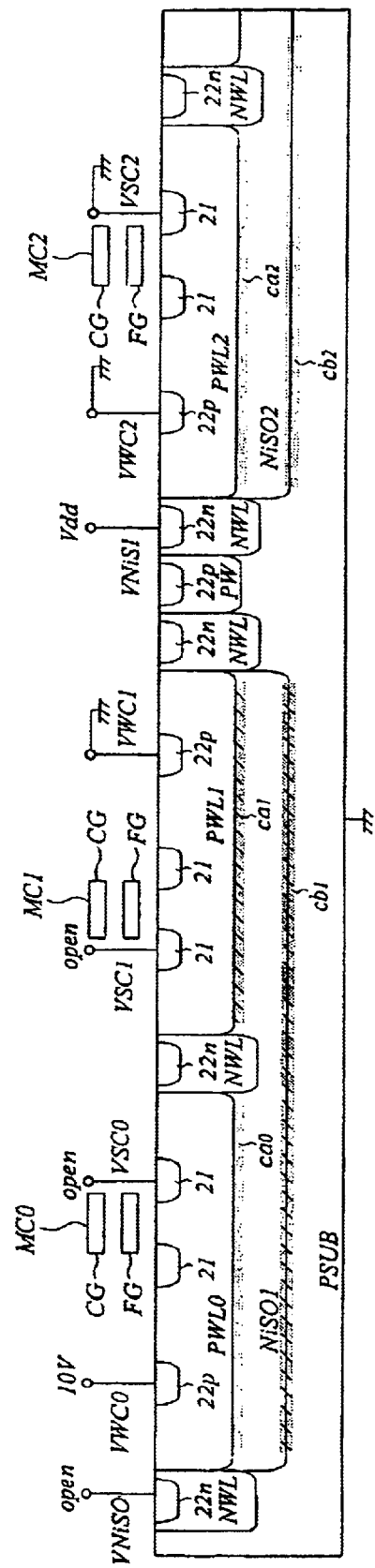
FIG. 13 shows voltages applied to p type wells and separation regions when data written to a flash memory in an embodiment according to the present invention is deleted.

FIG. 13 shows the configuration of a flash memory in the fourth embodiment and a voltage application state during the data deletion of the flash memory. Since the description of the configuration of each memory cell of this flash memory and the outlines of the write, read and deletion operations thereof are overlapped with the description of the first embodiment with reference to FIG. 25 to FIG. 27, only the configuration of the important parts of the flash memory and the deletion operation related to this embodiment will be described herein.

In respect of the configuration of the flash memory, a separation region NiSO1 which is formed of an n type semiconductor region is formed between p type wells PWL0 and PWL1 and a semiconductor substrate PSUB as in the case of the third embodiment described with reference to FIG. 8. In addition, a separation region NiSO2 which is formed of an n type semiconductor region is formed between a p type well PWL2 and the semiconductor substrate PSUB. Further, a p type well PW is formed between the separation regions NiSO1 and NiSO2.

As can be seen from FIG. 13, the separation region NiSO is divided at the intervals of some p type wells PWL's (deletion blocks).

In FIG. 13, a memory cell MC0 is a memory cell in a deletion block 0, a memory cell MC1 is a memory cell in a deletion block 1, and a memory MC2 is a memory cell in a deletion block 2. A voltage application state in a case where data written to the memory cells (MC0 and the like) in the deletion block 0 is deleted is shown in FIG. 13.

As shown in FIG. 13, a voltage of 10V is applied to the p type well PWL0 in which the selected memory cell MC0 is formed, and the separation region NiSO1 under the p type well PWL0 is maintained to be open. In addition, the voltages of the p type wells PWL1 and PWL2 in which the unselected memory cells MC1 and MC2 are formed are maintained to be 0V, respectively, and the voltage of the semiconductor substrate PSUB is maintained to be 0V. It is noted that the source and drain regions of each memory cells on the same separation region NiSO as that of the selected memory cell (designated deletion block) are maintained to be open, respectively. Further, the source and drain regions of the memory cells on the other separation regions NiSO are maintained to be 0V, respectively.

Figure 14:
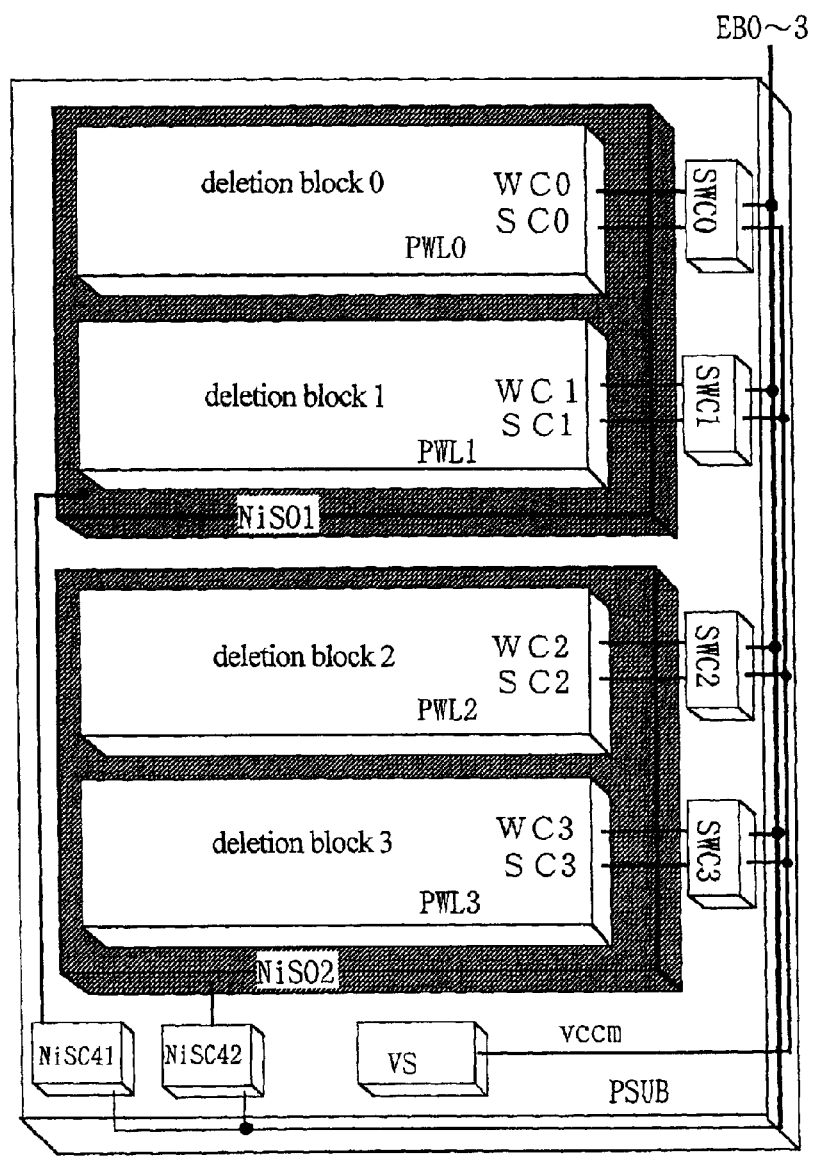
FIG. 14 shows the connection among the separation regions and the p type well, control circuits and a power supply circuit.

Here, a voltage (vccm, 10V) is supplied to the p type well PWL0 in which the selected memory cell MC0 is formed, from a voltage generation circuit in a power supply circuit VS (see FIG. 14).

FIG. 14 shows a division state of the separation region NiSO stated above and the connection among the separation regions NiSO and control circuits NiSO41 and NiSO42. As shown in FIG. 14, the separation region NiSO is divided at the intervals of two deletion blocks and the respective separation regions NiSO1 and NiSO2 are connected to the control circuits NiSO41 and NiSO42, respectively. Erasure block signals EB0 to EB3 are inputted into the control circuits NiSO41 and NiSO42, respectively. The separation region NiSO under the designated deletion block is maintained to be open.

Further, the voltage generation circuit in the power supply circuit VS is connected to the p type wells PWL0 to PWL3 through voltage control circuits SWC0 to SWC3, respectively. The deletion block signals EB0 to EB3 are inputted into the voltage control circuits SWC0 to SWC3, respectively, any one of the deletion blocks 0 to 3 (p type wells PWL0 to PWL3) is designated in accordance with the signals and a voltage is supplied to the designated block from the power supply circuit VS.

As shown in FIG. 13, a parasitic capacitance $Ca_1$ generated between the p type well PWL1 in which the unselected memory cell MC1 is formed and the separation region NiSO1 and a capacitance $Cb_1$ generated between the separation region NiSO and the semiconductor substrate PSUB are charged by the power supply circuit VS.

However, when data written to the memory cells (MC0 and the like) in the deletion block 0 is deleted, a parasitic capacitance $Ca_2$ and a parasitic capacitance $Cb_2$ are not generated between the p type well PWL1 in which the unselected memory cell MC2 is formed and the separation region NiSO2 and between the separation region NiSO2 and the semiconductor substrate PSUB, respectively. It is, therefore, possible to shorten deletion time.

Moreover, once the parasitic capacitances $Ca_2$ and $Cb_2$ stated above are charged, the separation region NiSO1 is maintained to be open. Therefore, in the second and the following deletion operations, it suffices to charge only a parasitic capacitance $Ca_0$ generated between the p type well WL1 and the separation region NiSO1, making it possible to shorten deletion time.

Figure 15:
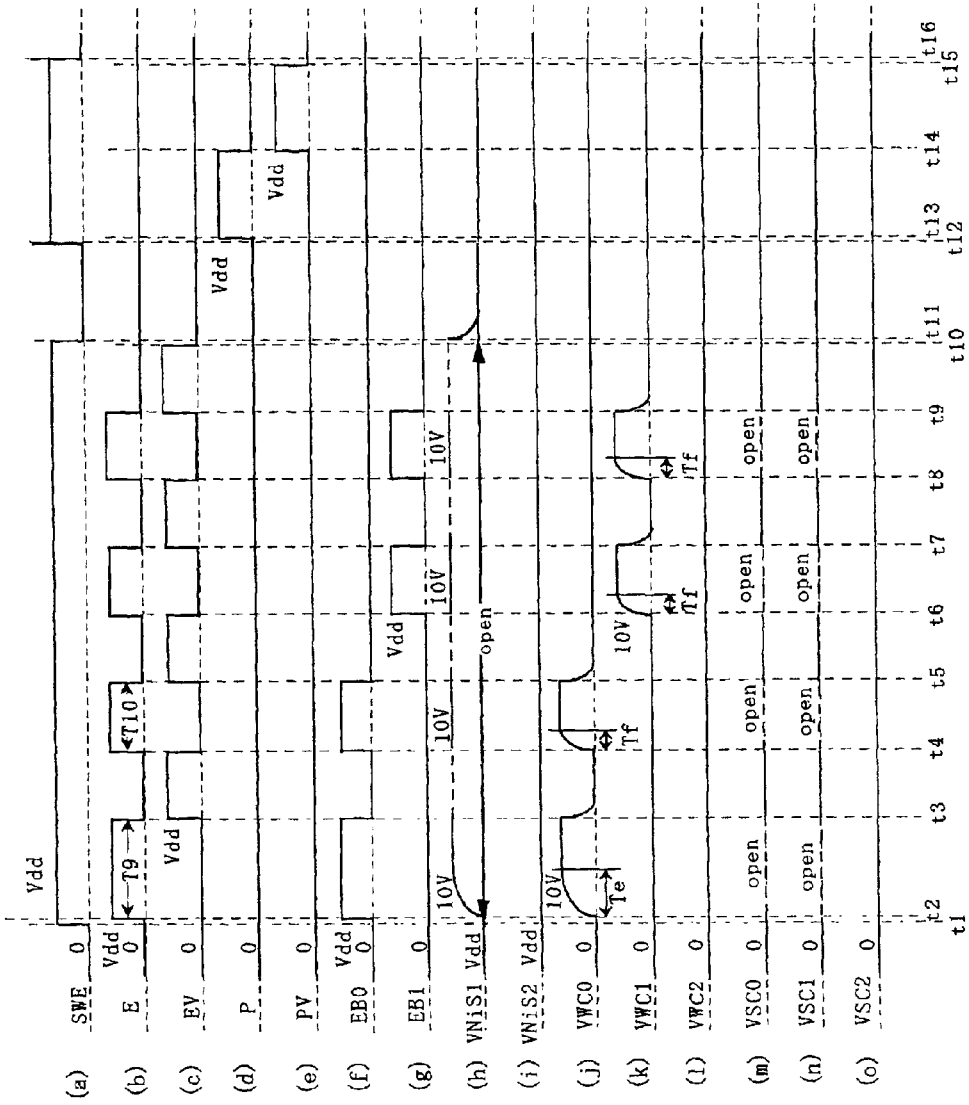
FIG. 15 is a timing chart showing the voltage changes of respective signals and sections during data deletion in an embodiment according to the present invention.

FIG. 15 is a timing chart showing the voltage changes of respective signals and sections during data deletion in this embodiment.

At time t1, an operation signal SWE becomes "1" and at time t2, a deletion signal E becomes "1" and a deletion block signal EB0 becomes "1" whereby the deletion block 0 is designated and data deletion starts. At this moment, a voltage of 10V is applied to the p type well PWL0 in which the selected memory cell MC0 is formed and the voltage of the separation region NiSO1 is thereby raised to 10V. As indicated by (h) and (j) of FIG. 15, it takes time Te (<Tz) until the voltage (VNiS1) of the separation region NiSO1 and the voltage (VWC0) of the p type well PWL0 become 10V, respectively. As indicated by (h) of FIG. 15, the separation region NiSO1 is maintained to be open after the time t1 until time t11 to be described later.

In this way, it take time Te until the voltages of the separation region NiSO1 and the p type well PWL0 become 10V, respectively. However, since the separation region is divided at the intervals of two deletion blocks, it is possible to reduce the parasitic capacitances $Ca_1$ and $Cb_1$, generated by the separation region NiSO1. As a result, deletion time can be shortened.

After a deletion operation is then carried out for a predetermined time, the deletion signal E becomes "0" and a deletion verification signal EV becomes "1" at time t3, whereby a verification operation starts. While this deletion verification signal EV is "1" (at t3 to t4), data (threshold voltage) determination is carried out. At this moment, the voltage of the p type well PWL0 in which the selected memory cell MC0 is formed is maintained to be 0V. In addition, the separation region NiSO is maintained to be open.

Next, at time t4, the deletion signal E becomes "1" and the deletion verification signal EV becomes "0", whereby re-deletion starts.

However, since the voltage of the separation region NiSO1 is raised and the raised voltage is maintained during the first deletion period (between t2 and t3) as described in the second embodiment, it suffices that the voltage generation circuit raises the voltage of the p type well PWL0 to 10V at time t4. As indicated by (j) of FIG. 15, it is possible to shorten time Tf (Tf<Te<Tz) until the voltage (VWC0) of the p type well PWWL0 becomes a desired voltage.

After a deletion operation is then carried out for a predetermined period, the deletion signal E becomes "0" and the deletion verification signal EV becomes "1" at time t5, whereby a verification operation starts. While this deletion verification signal EV is "1" (at t5 to t6), data (threshold voltage) determination is carried out. At this moment, the voltage of the p type well PWL0 is maintained to be 0V and the separation region NiSO1 is maintained to be open.

Next, if the data (threshold voltage) determination result is "OK", the deletion signal E becomes "1" and the deletion block signal EB1 becomes "1" at time t6, whereby the deletion block 1 is designated and data deletion starts. At this moment, a voltage of 10V is applied to the p type well PWL1 in which the selected memory cell MC1 is formed. As indicated by (h) and (k) of FIG. 15, since the voltage of the separation region NiSO1 is raised during the first deletion period (t2 to t3), it suffices that the voltage generation circuit raises the p type well PWL1 to 10V at time t6, making it possible to shorten deletion time (Tf).

Further, even if the voltage of the separation region NiSO1 is lowered, the parasitic capacitances $Ca_1$ and $Cb_1$ generated by the separation region NiSO1 are lower and the deletion time can be, therefore, shortened.

After a deletion operation is then carried out for a predetermined time, the deletion signal E becomes "0" and the deletion verification signal EV becomes "1" at time t7, whereby a verification operation starts. While this deletion verification signal EV is "1" (at t7 to t8), data (threshold voltage) determination is carried out. At this moment, the voltage of the p type well PWL1 in which the selected memory cell MC1 is formed is maintained to be 0V. The separation region NiSO1 is maintained to be open.

At time t8, the deletion signal E becomes "1" and the deletion verification signal EV becomes "0", whereby data deletion starts again.

In this case as in the case of the above, since the voltage of the separation region NiSO1 is raised during the first deletion period (t2 to t3), it suffices that that the voltage generation circuit raises the voltage of the p type well PWL1 to 10V at time t8, thereby making it possible to shorten time Tf (Tf<Te<Tz) until the voltage (VWC1) of the p type well PWL1 becomes a desired voltage as indicated by (k) of FIG. 15.

After a deletion operation is then carried out for a predetermined period, a verification operation starts (at t9) as in the case of the deletion block signal EB0.

During the above-stated periods (t1 to t9), in the periods (t2 to t3, t4 to t5, t6 to t7 and t8 to t9) in which data deletion and re-deletion are carried out, the source and drain regions 21 of the memory cells formed on the same separation region as that of the selected memory cells (designated deletion blocks) are maintained to be open.

After the deletion of data from the memory cells in the desire deletion block is stopped, the operation signal SWE becomes "0". At time t12, the operation signal SWE becomes "1" and at time t13, a write signal P becomes "1", whereby data write starts. At this moment, the voltages of the separation regions NiSO1 and NiSO2 are maintained to be Vdd and those of the p type wells PWL0 to PWL2 are maintained to be 0V, respectively. In addition, the source and drain regions 21 of each memory cell are maintained to be 0V.

After a write operation is then carried out for a predetermined period, the write signal P becomes "0" and the write verification signal PV becomes "1" at time t14, whereby a verification operation starts. While this write verification signal is "1" (at t14 to t15), data (threshold voltage) determination is carried out.

If the data (threshold voltage) determination result is "OK", the operation signal SWE becomes "0" at time t16.

As can be understood from the above, according to this embodiment, the separation region NiSO is divided at the intervals of predetermined units of deletion blocks and the voltage of the separation region NiSO corresponding to the designated deletion block is raised. It is, therefore, possible to reduce the parasitic capacitance. As a result, deletion time can be shortened.

Further, according to this embodiment, the separation region NiSO corresponding to the designated deletion block is maintained to be open during the deletion periods of t1 to t11. It is, therefore, possible to shorten time Tf until the voltage of each p type well in which the selected memory cell is formed becomes a desired voltage in the second and the following deletion operations.

As for the division units of the separation region NiSO, the separation region NiSO can be divided at the intervals of predetermined capacities (e.g., 128 kB) as described in the third embodiment with reference to FIGS. 11 and 12. As for the deletion blocks each having a small memory capacity (e.g., the deletion blocks EB0 to EB7 each of a memory capacity of 4 kB), the separation region NiSO can be divided at the intervals of small units (e.g., 16 kB). As for the deletion blocks each having a large memory capacity (e.g., the deletion blocks EB10 to EB15 each of a memory capacity of 64 kB), the separation region NiSO can be divided at intervals of relatively larger units (e.g., 192 kB).

In this way, as for the deletion block each having a small memory capacity and storing data to be deleted many time, the number of divisions of the separation region NiSO is set higher, whereby it is possible to further shorten deletion time.

Fifth Embodiment

Examples of the various circuits shown in the first to fourth embodiments will be described.

Figure 16A:
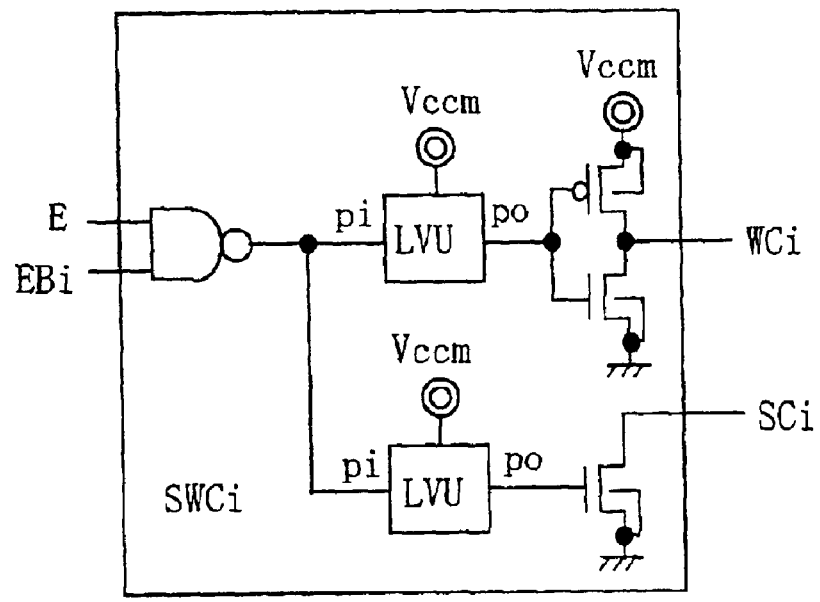
FIG. 16A shows the concrete configuration of the circuit used in an embodiment according to the present invention, and FIG. 16B also shows the concrete configuration of the circuit used in an embodiment according to the present invention.
Figure 16B:
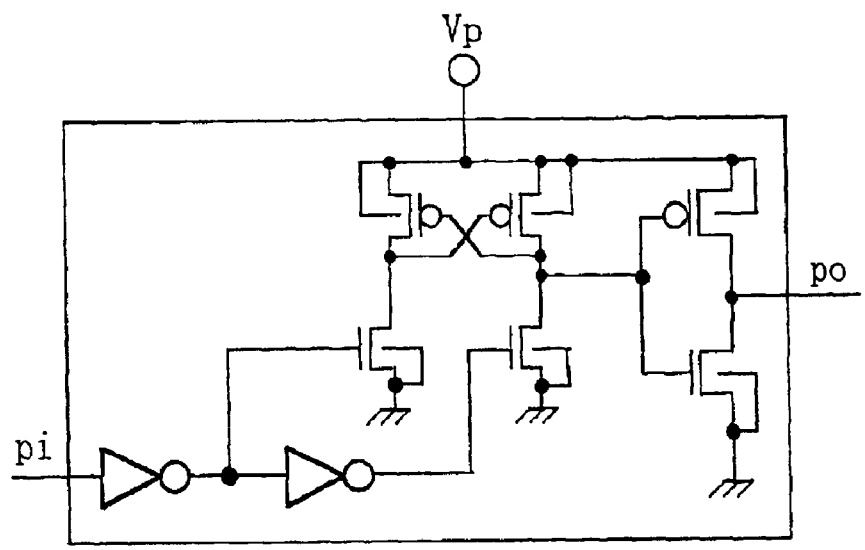

FIG. 16A shows one example of the voltage control circuit SWCi (where i=0 to 3) described in the first embodiment and the like. The circuit SWCi maintains the sources 21 of the selected memory cell and unselected memory cells to be open in response to a deletion block signal Ebi (where i=0 to 3) and a deletion signal E. In addition, the circuit SWCi supplies a predetermined voltage to the p type well in which a selected memory cell is formed. It is noted that LVU is a voltage level conversion circuit as shown in FIG. 16B (the same thing is true for FIGS. 17 to 23).

Figure 17:
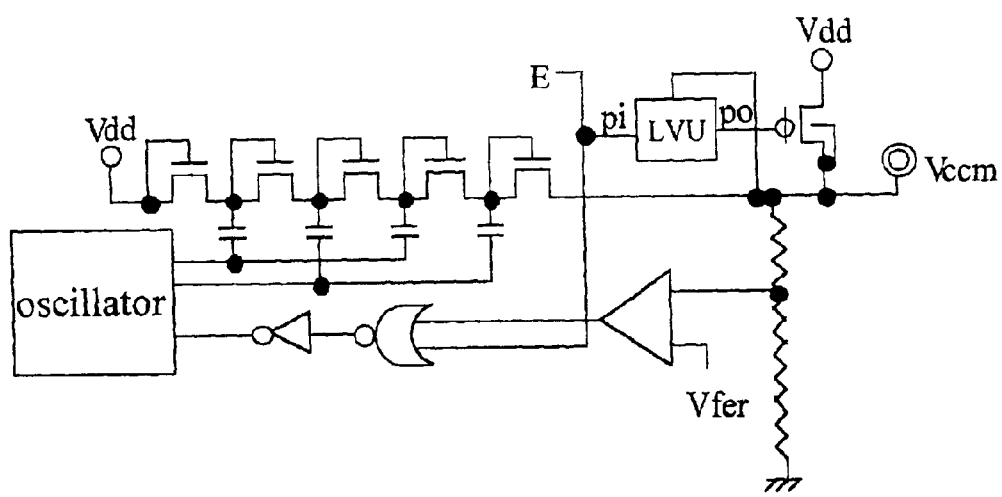
FIG. 17 shows the concrete configuration of the circuit used in an embodiment according to the present invention.
Figure 18:
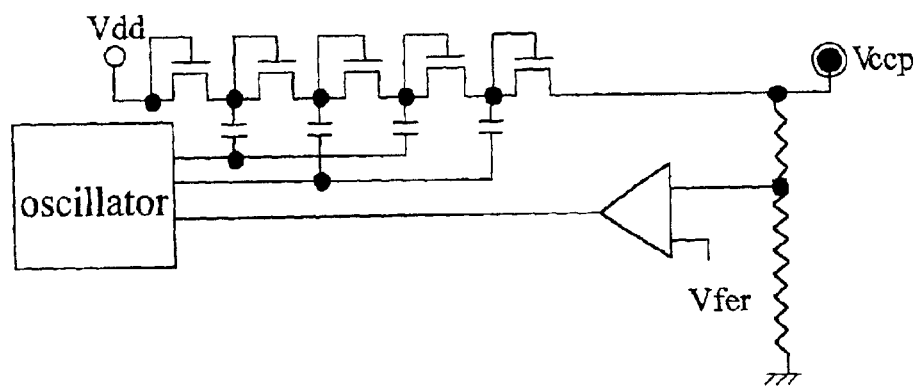
FIG. 18 shows the concrete configuration of the circuit used in an embodiment according to the present invention.

Furthermore, the boosted power supply circuit is formed in the power supply circuit VS described in the first embodiment and the like as shown in FIGS. 17 and 18.

Figure 19:
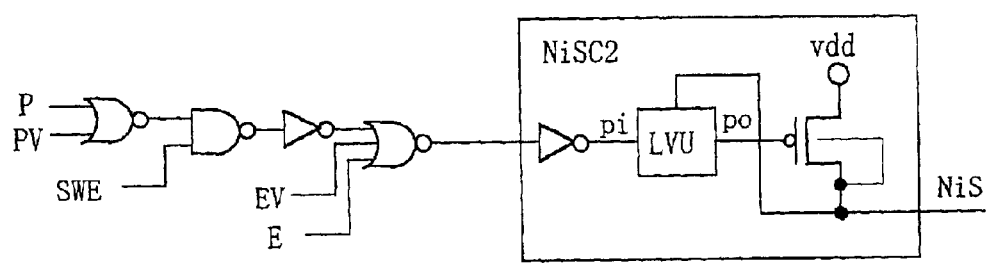
FIG. 19 shows the concrete configuration of the circuit used in an embodiment according to the present invention.
Figure 20:
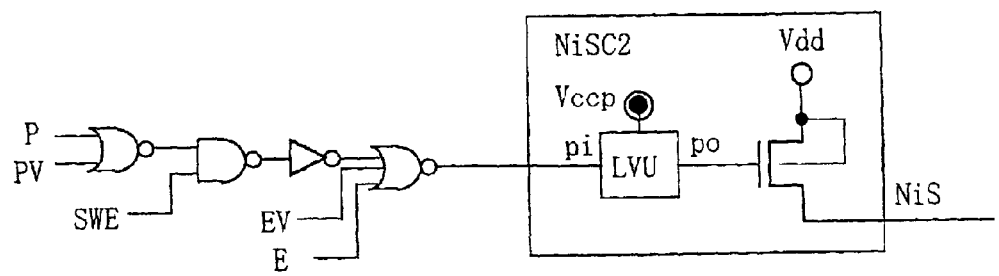
FIG. 20 shows the concrete configuration of the circuit used in an embodiment according to the present invention.

In addition, FIGS. 19 and 20 show one example of the control circuit NiSC2 described in the second embodiment. The circuit NiSC2 maintains the separation region NiSO to be open in response to the operation signal SWE, the deletion verification signal EV, the deletion signal E and the like.

Figure 21:
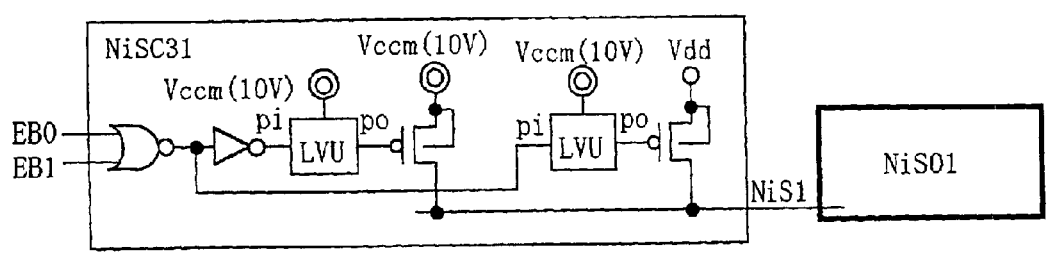
FIG. 21 shows the concrete configuration of the circuit used in an embodiment according to the present invention.
Figure 22:
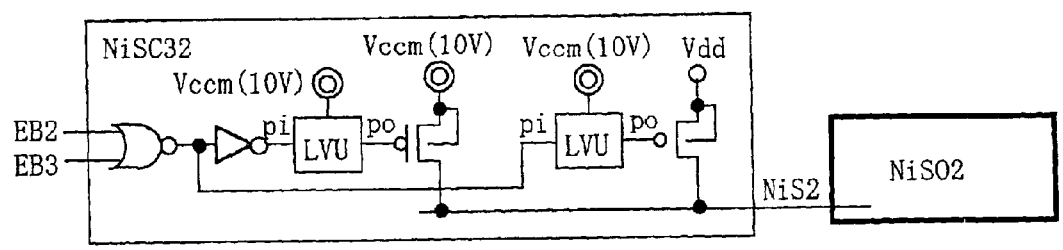
FIG. 22 shows the concrete configuration of the circuit used in an embodiment according to the present invention.

FIGS. 21 and 22 show one example of the control circuits NiSC31 and NiSC32 described in the third embodiment. The circuit NiSC31 or NiSC32 maintains the separation region (NiSO1 or NiSO2) to be open in response to the deletion block signals (EB0, EB1 or EB2, EB3) inputted into the deletion block on the divided separation region (NiSO1 or NiSO2).

Figure 23:
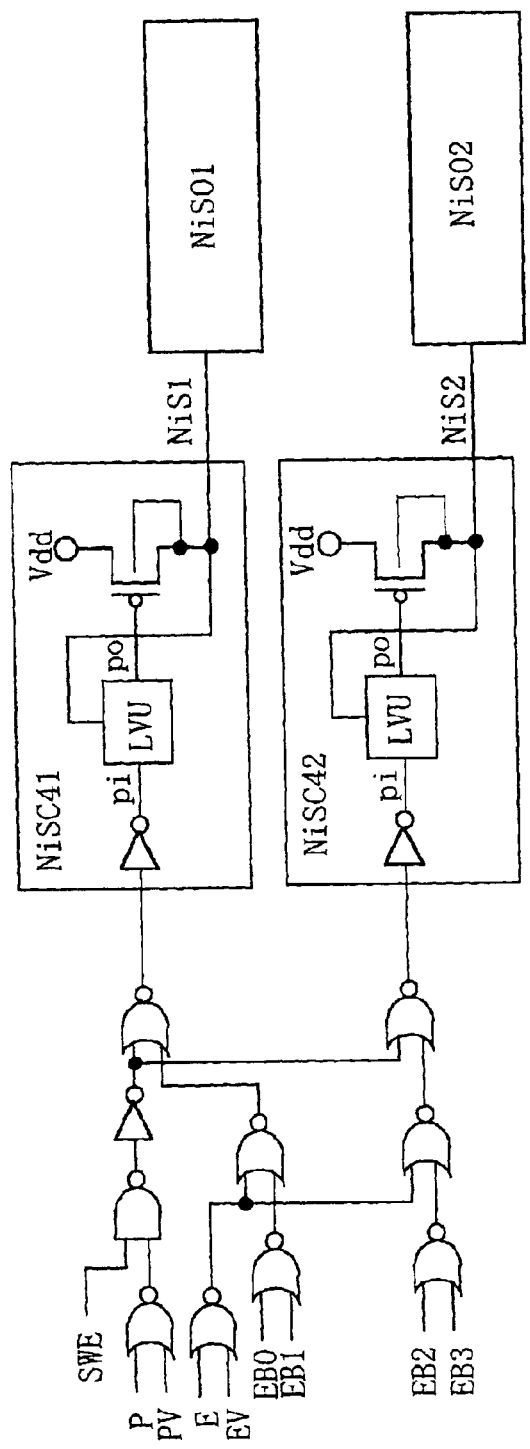
FIG. 23 shows the concrete configuration of the circuit used in an embodiment according to the present invention.

FIG. 23 shows one example of the control circuits NiSC41 and NiSC42 described in the fourth embodiment. The circuit NiSC41 or NiSC42 maintains the separation block (NiSO1 or NiSO2) to be open in response to the operation signal SWE, a deletion verification signal EV, a deletion signal E and the like as well as the deletion block signals (EB0, EB1 or EB2, EB3) inputted into the deletion block on the divided separation region (NiSO1 or NiSO2).

Sixth Embodiment

In the sixth embodiment, the relationship between the configuration of each memory cell of the flash memory shown in the first to fourth embodiments and a high withstand voltage MISFET (Metal Insulator Semiconductor Field Effect Transistor) and a low withstand voltage MISFET constituting peripheral circuits will be described.

Figure 33:
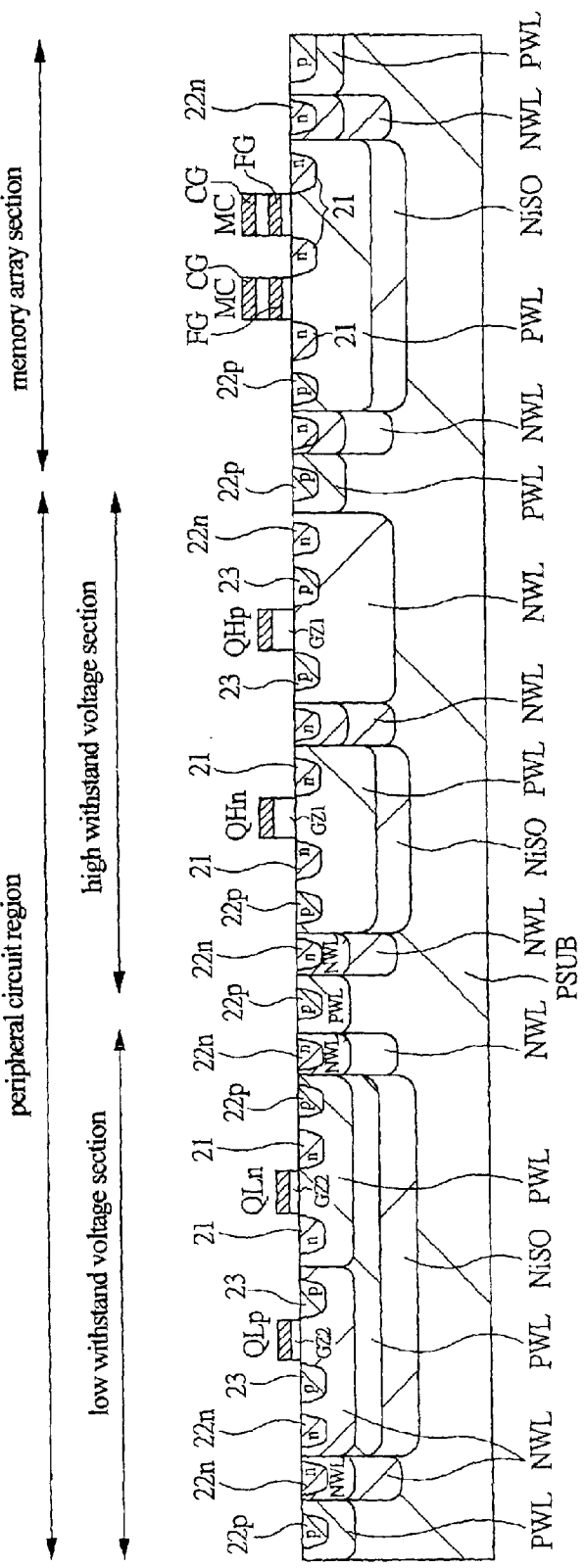
FIG. 33 shows the relationship between the flash memory (EEPROM) and a peripheral circuit region in an embodiment according to the present invention.

As shown in FIG. 33, a peripheral circuit region exists around the memory array section.

In this memory array section, a plurality of memory cells MC's are formed on the main surface of the p type wells PWL's formed in the semiconductor substrate PSUB. Since the configuration of each of these memory cells has been already described above in the first embodiment and the like with reference to FIG. 25, it will not be described in detail herein.

Further, in the peripheral circuit region, there exist a high withstand voltage section and a low withstand voltage section. In the high withstand voltage region, MISFETQHn and MISFETQHp each having a thick gate insulating film (GZ1) are formed. In the low withstand voltage region, MISFETQLn and MISFETQLp each having a thin gate insulating film (GZ2) are formed. It is noted that QHn and QLn are n channel MISFET's and that QHp and QLp are p channel MISFET's. Among the respective constituent elements of the peripheral circuit region, the same constituent elements as those of the memory array section are denoted by corresponding reference symbols and will not be described in detail herein.

By combining these MISFETQHn, MISFETQHp, MISFETQLn, MISFETQLp and the like, the various circuits described in the fifth embodiment are constituted.

Seventh Embodiment

In the seventh embodiment, a system employing the flash memory shown in the first to fourth embodiments will be described.

Figure 34:
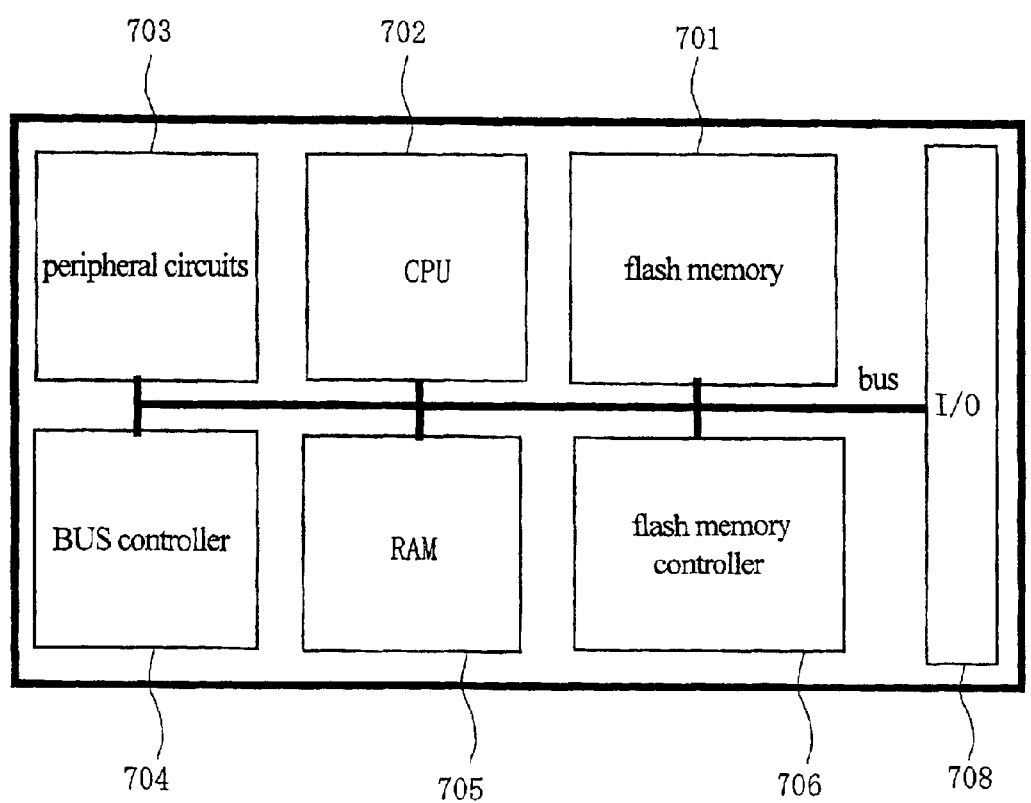
FIG. 34 is a system block diagram of a microcomputer including a flash memory.

FIG. 34 is, for example, a block diagram of a microcomputer system in which the above-stated flash memory is included.

As shown in FIG. 34, a flash memory 701 is controlled by a central processing unit (CPU) 702, a flash memory controller 706 and the like through a bus. In FIG. 34, reference symbol 703 denotes peripheral circuits, 704 denotes a bus controller, 705 denotes a RAM (Random Access Memory) section, and 708 denotes an input/output section.

Figure 35:
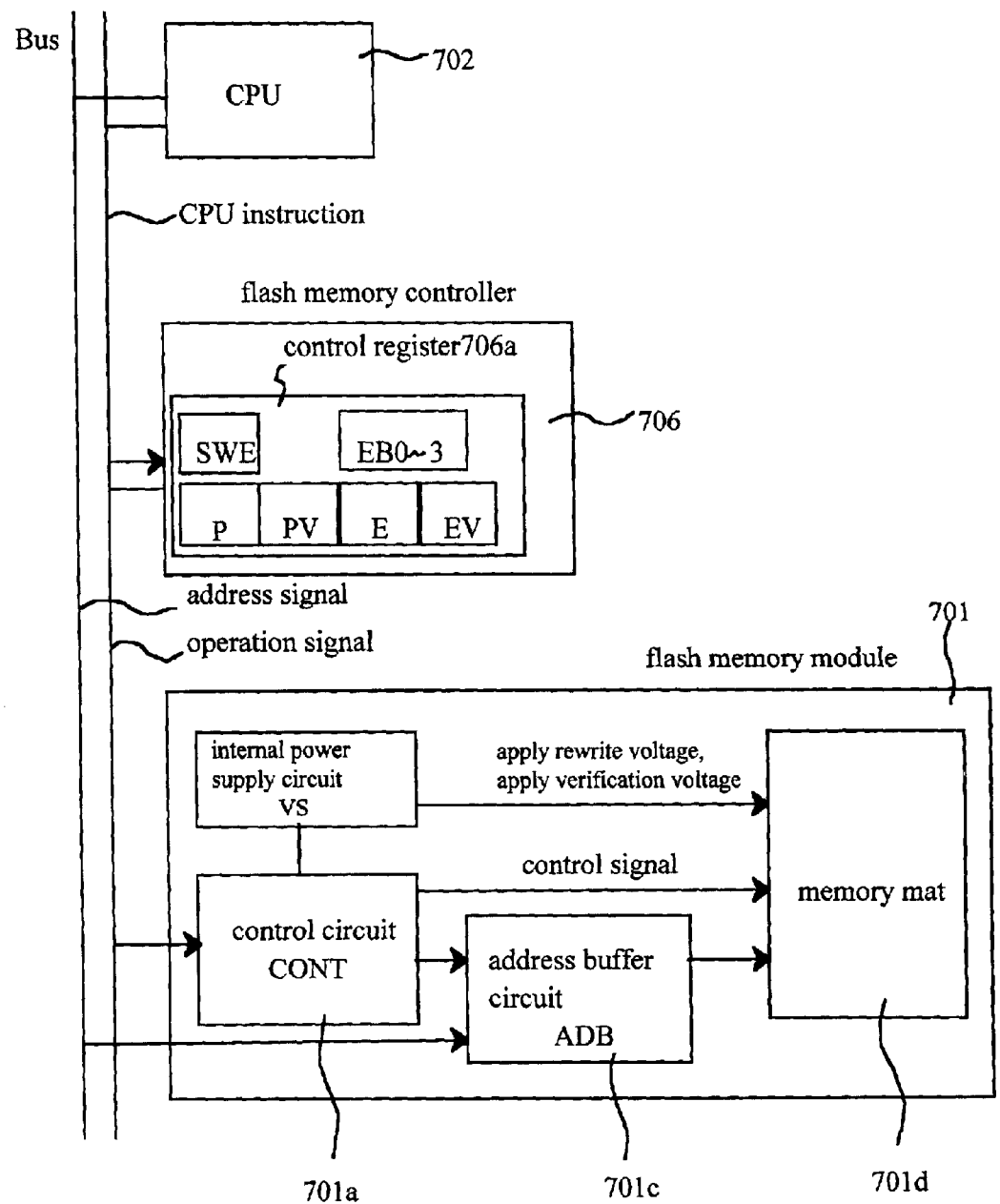
FIG. 35 shows the relationship among a CPU, a flash memory controller and a flash memory module.

As shown in, for example, FIG. 35, the CPU 702 transmits an instruction to a control register 706a in the flash memory controller 706 through the bus, and operation signals (SWE, EB0 to EB3, P, PV, E, EV) corresponding to this instruction are formed in this control register 706a. These operation signals are inputted into a power supply circuit VS through the bus and a control circuit 701a in the flash memory 701 module. An address signal is inputted into an address buffer circuit 701c in the flash memory 701 module from the CPU 702 through the bus and a memory cell in a memory mat 701d is selected to correspond to the address signal and the signals from the control circuit 701a. Further, as described in the first to fourth embodiments, a rewrite voltage, a verification voltage or the like is applied to the memory mat 701d by the power supply circuit VS.

Figure 36:
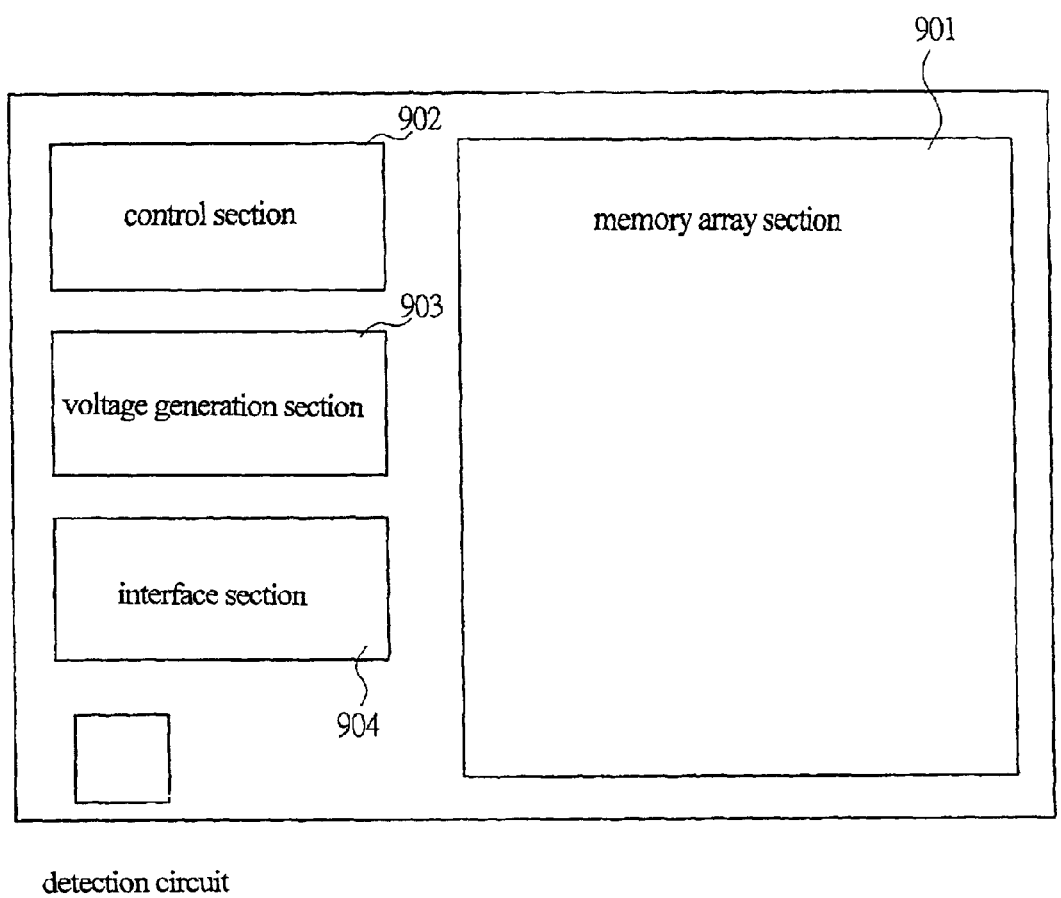
FIG. 36 is a schematic diagram of a memory card using flash memories.

FIG. 36 is a schematic diagram of a nonvolatile semiconductor memory employing the above-stated flash memory. The nonvolatile semiconductor memory includes a memory array section 901 which has the above-stated flash memory, a control section 902 which controls the operation of the nonvolatile semiconductor memory, a voltage generation section 903 which generates a voltage applied to the flash memory, and an interface section 904 which transmits and receives data to and from the outside, which is not shown, of the nonvolatile semiconductor memory on the single semiconductor substrate. The nonvolatile semiconductor memory receives an operation instruction as a command from the outside, allows the control section 902 to control operations including the reading of data stored in the memory array section 901, the writing of data, the deletion of data and the like in accordance with the above command.

The nonvolatile semiconductor memory may charge a parasitic capacitance generated in the separation region NiSO stated above in accordance with the external command to delete the data or with a command to write data to the region in which data is already stored (which will be referred to as "rewrite" hereinafter), or may receive a command to charge the parasitic capacitance generated in the separation region NiSO. Further, a voltage detection circuit which detects a voltage supplied into the nonvolatile semiconductor memory from the outside thereof may be provided so as to detect that the voltage supplied from the outside becomes a predetermined level and to charge the parasitic capacitance generated in the separation region NiSO, accordingly. In the rewrite operation stated above, the data stored in the region is deleted and then data is written to the region.

In case of a mass storage nonvolatile semiconductor memory used for so-called storage purposes, operations including a data deletion operation such as the data deletion and data rewrite occur relatively often. Due to this, if a necessary potential difference is applied only to the control electrode CG and a voltage of 0V is applied to the p type well in the deletion operation, a high voltage is applied to the gate insulating film GZ of the flash memory and a stress is thereby generated to give an upper limit to the number of times of rewrite. Due to this, to cause a relatively high potential difference by applying a positive voltage to the p type well region and a negative voltage to the control electrode CG in the data deletion operation is effective to reduce the stress generated in the gate insulating film GZ and to increase the number of times of the rewrite of the flash memory. Furthermore, to charge the parasitic capacitance generated in the separation region NiSO in advance by applying a positive voltage to the p type well region is effective to accelerate operations including the data deletion and data rewrite.

Figure 37:
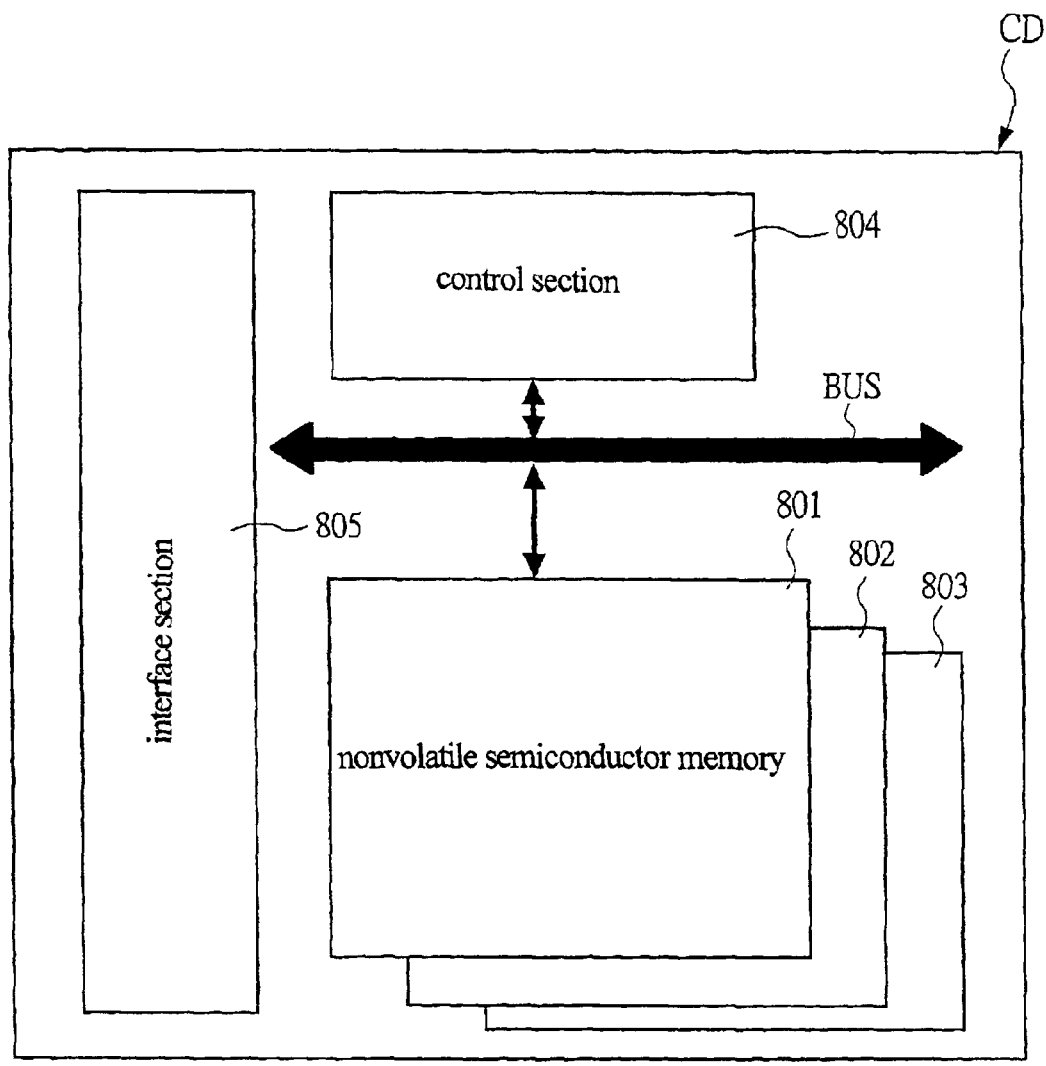
FIG. 37 is a schematic diagram showing a case where a memory array section, a control section, a voltage generation section and an interface section are formed on a single chip.

FIG. 37 is a schematic diagram of a memory card employing the nonvolatile semiconductor memory described with reference to FIG. 36. As shown in FIG. 37, a memory card CD includes nonvolatile semiconductor memories 801 to 803, a control section 804 and an interface section 805. While a plurality of nonvolatile semiconductor memories 801 to 803 are shown in FIG. 37, the number of the nonvolatile semiconductor memories is not limited to a specific number but may be only one. The interface section 805 receives an operation instruction from a host apparatus, which is not shown in FIG. 37, connected to the outside of the memory card CD. The operation instruction from the host apparatus is transmitted to the control section 804 through a bus BUS. The control section 804 issues commands to read data stored in the nonvolatile semiconductor memories 801 to 803, to write data or control the operation of data deletion or the like to the nonvolatile memories 801 to 803 in accordance with the operation instruction.

Each of the nonvolatile semiconductor memories may charge a separation region NiSO in accordance with the issued command to delete or rewrite the data from the control section 804 or may issue a command to charge the separation region NiSO from the control section 804. In this case, the memory card CD may be connected to the host apparatus and thereby supplied with power, and the control section 804 may initialize a register contained therein in accordance with the supply of the power and allow the register to hold information as to whether or not the separation region NiSO of each of the nonvolatile semiconductor memories 801 to 803 has been charged.

Each nonvolatile semiconductor memory employed in the memory card often has a large capacity to be used for storage purposed stated above. To accelerate operations including data deletion, rewrite and the like, a command may be simultaneously issued to a plurality of nonvolatile semiconductor memories or issue a command to one of the nonvolatile semiconductor memories and then issue a command to the other nonvolatile semiconductor memory before the operation of the command issued to the one nonvolatile semiconductor memory is completed.

The memory card is considered to be used for the transmission and receiving of data through a communication line. To be specific, the memory card is considered to be used to deliver music data using a cellular phone. If the memory card is used for such a purpose, data is rewritten relatively often. In addition, if it takes time to carry out a data deletion operation during data deletion, data rewrite or the like, the problem of an increase in communication time occurs. Due to this, it is effective to increase the number of times of rewrite and to accelerate the deletion operation for this purpose. Moreover, if the separation region NiSO is charged and discharged for each deletion operation, consumption power increases. For that reason, to decrease the number of times of charge and discharge of the separation region NiSO is also effective to reduce consumption power.

As can be seen, the nonvolatile semiconductor memory is applicable not only to the flash memory but also widely applicable to a mixture type apparatus, such as a microprocessor, wherein a logical circuit and a flash memory are mounted on the same semiconductor substrate.

The inventions made by the inventors of the present invention has been concretely described so far based on the embodiments. However, the present invention is not limited to these embodiments. Needless to say, various changes and modification can be made within the scope of the invention.

For example, the present invention has been described while using so-called DiNOR type memory cells used as memory cells. The present invention is also widely applicable to a nonvolatile semiconductor memory utilizing a deletion method for pulling out electrons in a charge accumulation layer by using memory cells of an AND type, a NAND type or the like and a potential difference between a control electrode and a semiconductor substrate (including a well and source and drain regions).

Among the inventions disclosed in the present application, advantages attained by the typical inventions will be briefly described as follows.

Since voltage application means different from means for applying a voltage to the first semiconductor region applies a voltage to the second semiconductor region (NiSO) formed between the semiconductor substrate and the first semiconductor region in which the nonvolatile memory cell is formed and a parasitic capacitance generated by the second semiconductor region is charged, it is possible to shorten time to delete data from each nonvolatile memory cell.

Further, means for prohibiting a voltage from being applied to the second semiconductor region formed between the semiconductor substrate and the first semiconductor region in which the nonvolatile memory cell is formed, is provided and the second semiconductor region is set to be open while the data is deleted from the nonvolatile memory cell. It is, therefore, possible to shorten deletion data for deleting data from each nonvolatile memory cell.

Moreover, the second semiconductor region formed between the semiconductor substrate and the first semiconductor region in which the nonvolatile memory cell is formed, is divided into a plurality of segments. It is, therefore, possible to reduce parasitic capacitances generated by the divided second semiconductor region and to shorten data deletion time for deleting the data from each nonvolatile memory cell.

What is claimed is:

1. A nonvolatile semiconductor memory comprising:
   (a) a memory cell comprising second semiconductor regions for a source and a drain, respectively, formed in a first semiconductor region in a semiconductor substrate; a charge accumulation layer formed on a region between said second semiconductor regions for the source and the drain, through a gate insulating film; and a control electrode provided on said charge accumulation layer through an insulating film;
   (b) a third semiconductor region formed between said first semiconductor region and the semiconductor substrate;
   (c) first voltage application means for applying a voltage to said control electrode;
   (d) a second voltage application means for applying a voltage to said first semiconductor region; and
   (e) a third voltage application means for applying a voltage to said third semiconductor region; and
   (f) means for determining a threshold voltage of said memory cell,
   wherein a first voltage is applied to said control electrode and a second voltage is applied to said first semiconductor region during a first period, thereby allowing electrons accumulated in said charge accumulation layer to be pulled out into said first semiconductor region,
   the threshold voltage of said memory cell is determined in a second period following said first period,
   if it is determined that the threshold voltage of said memory cell is higher than a predetermined threshold voltage, the first voltage is applied to said control electrode and the second voltage is applied to said first semiconductor region in a third period following said second period, thereby allowing the electrons accumulated in said charge accumulation layer to be pulled out into said first semiconductor region, and
   a third voltage is applied to said third semiconductor region during said first to third periods.

2. A nonvolatile semiconductor memory according to claim 1, wherein
   a first voltage is applied to the control electrode of said nonvolatile semiconductor memory, and a second voltage is applied to said first semiconductor region; and
   a potential difference between said first voltage and said second voltage corresponds to a voltage allowing electrons accumulated in said charge accumulation layer to be pulled out into said first semiconductor region.

3. A nonvolatile semiconductor memory according to claim 1, wherein
   a first voltage is applied to the control electrode of said nonvolatile semiconductor memory, and a second voltage is applied to said first semiconductor region; and
   a potential difference between said first voltage and said second voltage corresponds to a voltage allowing electrons accumulated in said charge accumulation layer to be pulled out into said first semiconductor region by a tunnel phenomenon.

4. A nonvolatile semiconductor memory according to claim 1, wherein
   a first voltage is applied to the control electrode of said nonvolatile semiconductor memory, a second voltage is applied to said first semiconductor region, and a third voltage is applied to said third semiconductor region; and
   said third voltage is higher than said second voltage.

5. A nonvolatile semiconductor memory according to claim 1, wherein
   said nonvolatile semiconductor memory applies a first voltage to said control electrode, and applies a second voltage to said first semiconductor region, thereby pulling out electrons accumulated in said charge accumulation layer into said first semiconductor region, to thereby allow data to be electrically deleted.

6. A nonvolatile semiconductor memory according to claim 1, wherein
   said nonvolatile semiconductor memory comprises a plurality of memory cell groups each having a plurality of said memory cells formed therein, and the memory cells in each memory cell group are formed above a non-separated third semiconductor region.

7. A nonvolatile semiconductor memory according to claim 1, wherein
   said nonvolatile semiconductor memory comprises a plurality of memory cell groups each having a plurality of said memory cells formed therein, and the memory cells in each memory cell group are formed above a third semiconductor region separated at intervals of units of a predetermined number of the memory cells.

8. A nonvolatile semiconductor memory according to claim 1, wherein
   said nonvolatile semiconductor memory comprises a plurality of first memory cell groups each having a plurality of said memory cells in units of a first predetermined number of the memory cells; and a plurality of second memory cell groups each having said memory cells in units of a second predetermined number of the memory cells, the second predetermined number being higher than said first predetermined number;
   the memory cells in said plurality of first memory cell groups are formed above a third semiconductor region separated at intervals of units of a third predetermined number of the memory cells; and
   the memory cells in said plurality of second memory cell groups are formed above the third semiconductor region separated at intervals of units of a fourth predetermined number of the memory cells, the fourth predetermined number being higher than the third predetermined number.

9. A data deletion method for a nonvolatile semiconductor memory, the nonvolatile semiconductor memory comprising:

a memory cell comprising second semiconductor regions for a source and a drain, respectively, formed in a first semiconductor region in a semiconductor substrate; a charge accumulation layer formed on a region between said second semiconductor regions for the source and the drain through a gate insulating film; and a control electrode provided on said charge accumulation layer through an insulating film; and a third semiconductor region formed between said first semiconductor region and the semiconductor substrate, wherein the data deletion method comprising the steps of:
applying a first voltage to said control electrode, applying a second voltage to said first semiconductor region, and pulling out electrons accumulated in said charge accumulation layer into said first semiconductor region based on a potential difference between said first voltage and said second voltage in a first period;
determining a threshold voltage of said memory cell in a second period following said first period; and
applying the first voltage to said control electrode, applying the second voltage to said first semiconductor region and thereby pulling out the electrons accumulated in said charge accumulation layer into said first semiconductor region in a third period following said second period if the threshold voltage of said memory cell is higher than a predetermined threshold voltage, and wherein
a third voltage is applied to said third semiconductor region during said first to third periods.

10. A data deletion method for a nonvolatile semiconductor memory, according to claim 9, wherein said third voltage is higher than said second voltage.

11. A nonvolatile semiconductor memory comprising:

(a) a memory cell comprising second semiconductor regions for a source and a drain, respectively, formed in a first semiconductor region in a semiconductor substrate; a charge accumulation layer formed on a region between said second semiconductor regions for the source and the drain through a gate insulating film; and a control electrode provided on said charge accumulation layer through an insulating film;

(b) a third semiconductor region (NiSO) formed between said first semiconductor region and the semiconductor substrate;

(c) first means for applying a voltage to said control electrode;

(d) second means for applying a voltage to said first semiconductor region; and (e) third means for prohibiting a voltage from being applied to said third semiconductor region, and (f) means for determining a threshold voltage of said memory cell, wherein the conductive type of said first semiconductor region is a p type and that of said third semiconductor region is an n type, a first voltage is applied to said control electrode and a second voltage is applied to said first semiconductor region in a first period, thereby allowing electrons accumulated in said charge accumulation layer to be pulled out into said first semiconductor region, the threshold voltage of said memory cell is determined in a second period following said first period, if it is determined that the threshold voltage of said memory cell is higher than a predetermined threshold voltage, the first voltage is applied to said control electrode and the second voltage is applied to said first semiconductor region in a third period following said second period, thereby allowing the electrons accumulated in said charge accumulation layer to be pulled out into said first semiconductor region, a second voltage is applied to said first semiconductor region in said first period and thereby said third semiconductor region is charged through said first semiconductor region up to said second voltage, and said third semiconductor region is maintained in a floating state during said first to third periods.

12. A nonvolatile semiconductor memory according to claim 11, wherein a first voltage is applied to the control electrode of said nonvolatile semiconductor memory, and a second voltage is applied to said first semiconductor region; and a potential difference between said first voltage and said second voltage corresponds to a voltage allowing electrons accumulated in said charge accumulation layer to be pulled out into said first semiconductor region.

13. A nonvolatile semiconductor memory according to claim 11, wherein a first voltage is applied to the control electrode of said nonvolatile semiconductor memory, and a second voltage is applied to said first semiconductor region; and a potential difference between said first voltage and said second voltage corresponds to a voltage allowing electrons accumulated in said charge accumulation layer to be pulled out into said first semiconductor region by a tunnel phenomenon.

14. A nonvolatile semiconductor memory according to claim 11, wherein a first voltage is applied to the control electrode of said nonvolatile semiconductor memory by said first means; a second voltage is applied to said first semiconductor region by said second means; and said third semiconductor region is maintained in a floating state by said third means.

15. A nonvolatile semiconductor memory according to claim 11, wherein said nonvolatile semiconductor memory applies a first voltage to said control electrode, and applies a second voltage to said first semiconductor region, thereby pulling out electrons accumulated in said charge accumulation layer into said first semiconductor region, to thereby allow data to be electrically deleted.

16. A nonvolatile semiconductor memory according to claim 11, wherein said nonvolatile semiconductor memory comprises a plurality of memory cell groups each having a plurality of said memory cells formed therein, and the memory cells in each memory cell group are formed above a non-separated third semiconductor region.

17. A nonvolatile semiconductor memory according to claim 11, wherein said nonvolatile semiconductor memory comprises a plurality of memory cell groups each having a plurality of said memory cells formed therein, and the memory cells in each memory cell group are formed above a third semiconductor region separated at intervals of units of a predetermined number of the memory cells.

18. A nonvolatile semiconductor memory according to claim 11, wherein said nonvolatile semiconductor memory comprises a plurality of first memory cell groups each having a plurality of said memory cells in units of a first predetermined number of the memory cells; and a plurality of second memory cell groups each having said memory cells in units of a second predetermined number of the memory cells, the second predetermined number being higher than said first predetermined number;

the memory cells in said plurality of first memory cell groups are formed above a third semiconductor region separated at intervals of units of a third predetermined number of the memory cells; and said first semiconductor region having the memory cells in said plurality of second memory cell groups formed therein is formed in the third semiconductor region separated at intervals of units of a fourth predetermined number of the memory cells, the fourth predetermined number being higher than the third predetermined number.

19. A data deletion method for a nonvolatile semiconductor memory, the nonvolatile semiconductor memory comprising:

a memory cell comprising second semiconductor regions for a source and a drain, respectively, formed in a first semiconductor region in a semiconductor substrate; a charge accumulation layer formed on a region between said second semiconductor regions for the source and the drain through a gate insulating film; and a control electrode provided on said charge accumulation layer through an insulating film; and a third semiconductor region formed between said first semiconductor region and the semiconductor substrate, wherein the data deletion method comprises the steps of:
applying a first voltage to said control electrode, applying a second voltage to said first semiconductor region, and pulling out electrons accumulated in said charge accumulation layer into said first semiconductor region based on a potential difference between said first voltage and said second voltage in a first period;

determining a threshold voltage of said memory cell in a second period following said first period; and applying the first voltage to said control electrode, applying the second voltage to said first semiconductor region and thereby pulling out the electrons accumulated in said charge accumulation layer, into said first semiconductor region in a third period following said second period if the threshold voltage of said memory cell is higher than a predetermined threshold voltage, and wherein the conductive type of said first semiconductor region is a p type and that of said third semiconductor region is an n type, a second voltage is applied to said first semiconductor region in said first period and thereby said third semiconductor region is charged through said first semiconductor region up to said second voltage, and said third semiconductor region is maintained in a floating state during said first to third periods.

20. A nonvolatile semiconductor memory comprising:

(a) a plurality of memory cell groups each having a plurality of memory cells formed on a main surface of a first semiconductor region in a semiconductor substrate, each memory cell comprising second semiconductor regions for a source and a drain, respectively, formed in said first semiconductor region; a charge accumulation layer formed on a region between the second semiconductor regions for the source and the drain through a gate insulating film; and a control electrode provided on said charge accumulation layer through an insulating film;

(b) a third semiconductor region formed between said first semiconductor region and the semiconductor substrate;

(c) first voltage application means for applying a voltage to said control electrode; and (d) second voltage application means for applying a voltage to said first semiconductor region and said third semiconductor region, respectively, wherein said third semiconductor region is separated at intervals units of a predetermined number of the memory cells in the plurality of memory cell groups.

21. A nonvolatile semiconductor memory according to claim 20, wherein a first voltage is applied to the control electrode of said nonvolatile semiconductor memory, and a second voltage is applied to said first semiconductor region and said third semiconductor region, respectively; and a potential difference between said first voltage and said second voltage corresponds to a voltage allowing electrons accumulated in said charge accumulation layer to be pulled out into said first semiconductor region.

22. A nonvolatile semiconductor memory according to claim 20, wherein a first voltage is applied to the control electrode of said nonvolatile semiconductor memory, and a second voltage is applied to said first semiconductor region and said third semiconductor region, respectively; and a potential difference between said first voltage and said second voltage corresponds to a voltage allowing electrons accumulated in said charge accumulation layer to be pulled out into said first semiconductor region by a tunnel phenomenon.

23. A nonvolatile semiconductor memory according to claim 20, wherein said plurality of memory cell groups comprise a plurality of first memory cell groups each having a plurality of said memory cells in units of a first predetermined number of the memory cells; and a plurality of second memory cell groups each having said memory cells in units of a second predetermined number of the memory cells, the second predetermined number being higher than said first predetermined number;

the memory cells in said plurality of first memory cell groups are formed above a third semiconductor region separated at intervals of units of a third predetermined number of the memory cells; and the memory cells in said plurality of second memory cell groups are formed above the third semiconductor region separated at intervals of units of a fourth predetermined number of the memory cells, the fourth predetermined number being higher than the third predetermined number;

the memory cells in said plurality of first memory cell groups are formed above a third semiconductor region separated at intervals of units of a third predetermined number of the memory cells; and the memory cells in said plurality of second memory cell groups are formed above the third semiconductor region separated at intervals of units of a fourth predetermined number of the memory cells, the fourth predetermined number being higher than the third predetermined number.

* * * * *